United States Patent
Fukuda et al.

(10) Patent No.: US 6,924,526 B2
(45) Date of Patent: Aug. 2, 2005

(54) SEMICONDUCTOR DEVICE AND METHOD FOR FABRICATING THE SAME

(75) Inventors: Masatoshi Fukuda, Kawasaki (JP); Kouji Tsunoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/020,951

(22) Filed: Dec. 19, 2001

(65) Prior Publication Data

US 2002/0079526 A1 Jun. 27, 2002

(30) Foreign Application Priority Data

Feb. 26, 2000 (JP) .................................... 2000-394492

(51) Int. Cl.⁷ .............................................. H01L 29/92
(52) U.S. Cl. ................... 257/309; 257/532; 257/534; 257/296; 257/300; 257/308
(58) Field of Search .................. 257/296, 300, 257/308, 309, 532, 534, 306; 365/149

(56) References Cited

U.S. PATENT DOCUMENTS 5,023,683 A * 6/1991 Yamada ...................... 257/309
5,108,943 A * 4/1992 Sandhu et al. ............... 438/254
5,481,127 A * 1/1996 Ogawa ........................ 257/308
6,380,579 B1 * 4/2002 Nam et al. .................. 257/295

FOREIGN PATENT DOCUMENTS

| JP | Hei 05-110025 | 4/1993 |
| JP | Hei 05-114711 | 5/1993 |
| JP | Hei 08-181231 | 7/1996 |
| JP | Hei 09-181278 | 7/1997 |
| JP | Hei 10-050949 | 2/1998 |
| JP | 10-050949 | * 2/1998 |

\* cited by examiner

*Primary Examiner*—Tom Thomas
*Assistant Examiner*—Matthew C Landau
(74) *Attorney, Agent, or Firm*—Westerman, Hattori, Daniels & Adrian, LLP

(57) ABSTRACT

The semiconductor device comprises a capacitor including a storage electrode 76, a capacitor dielectric film formed on the storage electrode 76, and a plate electrode formed on the capacitor dielectric film 78, the storage electrode 76 having an upper end rounded and having a larger thickness at the upper end than a thickness in the rest region. Whereby electric field concentration on the upper end of the storage electrode can be mitigated, and leakage current increase and dielectric breakdown of the capacitor dielectric film can be precluded.

9 Claims, 28 Drawing Sheets

120

120

120

120

120

120

120

120

SEMICONDUCTOR DEVICE AND METHOD FOR FABRICATING THE SAME

BACKGROUND OF THE INVENTION

The present invention relates to a semiconductor device and a method for fabricating the semiconductor device, more specifically to a semiconductor device including a capacitor using a cylindrical or a pillar-shaped storage electrode.

DRAM is a semiconductor memory device which each of the memory cells can be comprised of one transistor and one capacitor. Various structures of DRAM and methods for forming the structures have been conventionally studied to fabricate high density and highly integrated semiconductor storage devices. Especially a structure of the capacitor of DRAM much influences high integration, and it is important how to ensure a required storage capacitance without interfering with high integration of the device.

For high integration, it is essential to make a memory cell area small, and an area for a capacitor to be formed in is required to be small. Then, it is proposed that a capacitor including a pillar-shaped or cylindrical storage electrode is used, whereby the capacitor has a surface area increased height-wise so as to ensure a required storage capacitance without having a floor area increased.

A method for fabricating a conventional semiconductor device will be explained with reference to FIGS. 26A–26C and 27A–27B.

First, a memory cell transistor including a gate electrode 204 and source/drain diffused layers 206 is formed on a silicon substrate 200 in the same way as in the usual MOS transistor fabrication method (FIG. 26A).

Next, a silicon oxide film is deposited by, e.g., CVD (Chemical Vapor Deposition) method on the silicon substrate 200 with the memory cell transistor formed on, and then the surface of the silicon oxide film is polished by, CMP (Chemical Mechanical Polishing) method to form an inter-layer insulation film 208 which is formed of the silicon oxide film and has the surface planarized.

Then, a contact hole 210 is formed in the inter-layer insulation film 208 down to the source/drain diffused layer 206 by lithography and etching.

Next, a conducting film is deposited by, e.g., CVD method and is polished until the surface of the inter-layer insulation film 208 is exposed by, e.g., CMP method to form a plug 212 buried in the contact hole 210 (FIG. 26B).

Then, a silicon oxide film is deposited by, e.g., CVD method on the inter-layer insulation film 208 with the plug 212 buried in to form an inter-layer insulation film 214 of the silicon oxide film.

Next, an opening 216 exposing the plug 212 is formed in the inter-layer insulation film 214 by lithography and etching.

Then, a ruthenium film is deposited on the entire surface by, e.g., CVD method and polished by, e.g., CMP method until the surface of the inter-layer insulation film 214 is exposed to form a cylindrical storage electrode 218 of the ruthenium film formed on the inside wall and the bottom of the opening 216 (FIG. 26C).

Then, when the so-called cylindrical capacitor using the inside surface and the outside surface of the cylindrical storage electrode 218 is formed, the inter-layer insulation film 214 is removed selectively with respect to the inter-layer insulation film 208 to expose the outside surface of the storage electrode 218. Then, a capacitor dielectric film 220 of, e.g., $Ta_2O_5$ and a plate electrode 222 of, e.g., ruthenium film are deposited by, e.g., CVD method to form a capacitor constituted by the storage electrode 218, the capacitor dielectric film 220 and the plate electrode 222 (FIG. 27A).

Other wise, when the so-called concave capacitor using the inside surface of a cylindrical storage electrode is formed, a dielectric film 220 of, e.g., $Ta_2O_5$ and a plate electrode 222 of, e.g., ruthenium film are deposited by, e.g., CVD method without removing the inter-layer insulation film 214, and a capacitor constituted by the storage electrode 218, the capacitor dielectric film 220 and the plate electrode 222 is formed (FIG. 27B).

Thus, a DRAM including the capacitor using the cylindrical storage electrode is fabricated.

In the conventional semiconductor device fabrication method, the conducting film on the inter-layer insulation film 214 is removed by CMP method to form the storage electrode 218 selectively in the opening 216, and consequently, an edge as shown in FIG. 28A is formed on the upper end of the thus-formed storage electrode 218. Especially in a case that dishing takes place in polishing by CMP method, an acute edge as shown in FIG. 28B is formed on the upper end of the storage electrode 218 because a side of the storage electrode 218 near the inside surface is more polished than a side of the storage electrode 218 near the outside surface.

When an edge is thus formed on the upper end of the storage electrode 218, an electric field is concentrated on the edge to thereby often degrade drastically insulation of the capacitor dielectric film 220 in comparison with the insulation of the capacitor dielectric film having planar electrode. Especially when the edge is acutely angled, a large electric field is applied intensively on the edge, often causing dielectric breakdown to the capacitor dielectric film 220.

SUMMARY OF THE INVENTION

An object of the present invention is to provide a semiconductor device comprising a capacitor using a pillar-shaped or cylindrical storage electrode, which can mitigate electric field concentration on the upper end of the storage electrode for high insulation, and a method for fabricating the semiconductor device.

According to one aspect of the present invention, there is provided a semiconductor device comprising: a capacitor formed above a semiconductor substrate and including a storage electrode, a capacitor dielectric film formed on the storage electrode and a plate electrode formed on the capacitor dielectric film, the storage electrode having an upper end rounded and having a larger thickness at the upper end than a thickness in the rest region.

According to another aspect of the present invention, there is provided a semiconductor device comprising: a capacitor formed above a semiconductor substrate and including a storage electrode, a capacitor dielectric film formed on the storage electrode and a plate electrode formed on the capacitor dielectric film, the storage electrode being formed of a metal film and having a larger thickness at the upper end than a thickness in the rest region.

According to further another aspect of the present invention, there is provided a semiconductor device comprising: a capacitor formed above a semiconductor substrate and including a storage electrode, a capacitor dielectric film formed on the storage electrode and a plate electrode formed on the capacitor dielectric film, the storage electrode being formed of a metal film and having an upper end rounded.

According to further another aspect of the present invention, there is provided a method for fabricating a semiconductor device comprising the steps of: forming an insulation film above a semiconductor substrate; forming an opening in the insulation film; forming a storage electrode electrically connected to the semiconductor substrate and formed in the opening; conducting a heat treatment to round an upper end of the storage electrode; forming a capacitor dielectric film on the storage electrode; and forming a plate electrode on the capacitor dielectric film.

According to the present invention, the semiconductor device using pillar-shaped or cylindrical storage electrodes have the edges of the upper ends of the storage electrodes rounded in a substantially spherical configuration, whereby electric field concentration on the upper ends of the storage electrodes can be mitigated, and leakage current increase and dielectric breakdown of the capacitor dielectric film can be precluded.

DETAILED DESCRIPTION OF THE INVENTION

[Principle of the Present Invention]

Figure 1A:
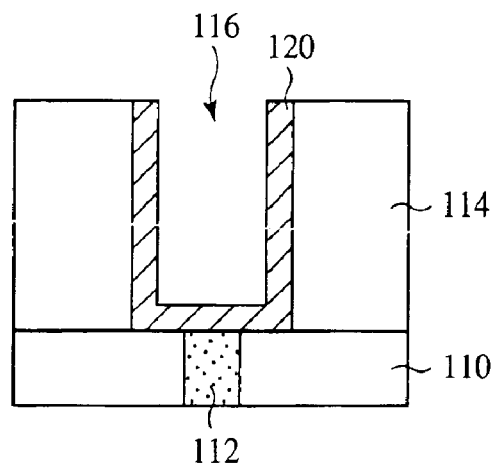
FIGS. 1A–1C, 2A–2D, and 3A–3D are views explaining the steps of a heat treatment for rounding the edges of the storage electrodes.

The present invention is characterized mainly in that the edge of the upper end of a storage electrode is rounded after the storage electrode has been formed and before a capacitor dielectric film is formed.

A metal film is formed and then subjected to a heat treatment at a temperature lower than the melting point of the metal material so as to accelerate the spontaneous structural formation of the material, and the metal film has the crystals reconstituted. Especially at the edge of the metal film, the reconstitution of the crystals goes on, forming the edge in a spherical shape, which has low surface energy and is stable. Accordingly, a heat treatment is made at a temperature higher than a temperature at which crystal reconstitution takes place, after the storage electrode has been formed, whereby the upper end of the storage electrode can be rounded.

Conditions for the heat treatment for rounding the edge of the storage electrode are different depending on a material forming the storage electrode. For example, in a case where the storage electrode is formed of ruthenium film, the heat treatment for rounding the edge is preferably performed in an atmosphere containing no oxygen and at a temperature of about 300–750° C.

The inventors of the present application have earnest studies of the conditions of the heat treatment and found that the heat treatment does not round the edge of the storage electrode in an atmosphere containing oxygen but does in an atmosphere containing no oxygen. They also observed oxygen in the film and found that the specimen before the heat treatment contained a small amount of oxygen, but the oxygen has disappeared in the specimen after the heat treatment, which had the edge rounded.

Based on this finding, the reconstitution of the crystals of the ruthenium film by the heat treatment is much related with oxygen contained in the film. The oxygen is removed from the film whereby the reconstitution of the crystals of the ruthenium is accelerated, crystal grain diameters are increased, and the edge is rounded in a spherical shape, which has low surface energy.

Accordingly, as an atmosphere for the heat treatment, an atmosphere which efficiently, removes oxygen from the film and takes in no oxygen, i.e., a vacuum atmosphere, a hydrogen atmosphere, an atmosphere of an inert gas, such as nitrogen or others, are suitable.

In ruthenium, the crystal reconstitution takes place at a temperature above about 300° C. Accordingly, a temperature of the heat treatment for rounding the edge of the storage electrode must be set to be above at least 300° C.

On the other hand, an excessively high heat treatment temperature makes crystal grain diameters of ruthenium too large, with results that the base film is exposed, and a shape of the storage electrode is much changed. The storage electrode cannot have a configuration which is usable as the storage electrode. A thermal budge to be applied to the DRAM must be considered. Accordingly, it is preferable to set an upper limit of the heat treatment temperature suitably in consideration of the above.

An upper limit of the heat treatment temperature is also different depending on an initial configuration of the storage electrode. A high heat treatment temperature can be set for the concave capacitor and the pillar-shaped capacitor because the electrodes of the concave capacitor and the pillar-shaped capacitor are not easily deformed by the heat treatment of high temperatures. On the other hand, the cylindrical capacitor has the electrode easily deformed, and often has a trouble that the heat treatment of high temperatures beings adjacent storage electrodes into contact with each other. An upper limit of the heat treatment temperature for the cylindrical capacitor is lower in comparison with the that for the concave capacitor and the pillar-shaped capacitor. In the heat treatment using a furnace, the heat treatment of 10 minutes to several hours at 500–600° C. is practical for the cylindrical capacitor, and the heat treatment of 10 minutes to several hours at 550–700° C. is practical for the concave capacitor.

An upper limit of the heat treatment temperature is also different depending on a method for the heat treatment. For example, a heat treatment made by using a furnace has a long heat treatment period of time and a relatively low heat treatment temperature. On the other hand, a heat treatment by RTA (Rapid Thermal Annealing) can have a short heat treatment period of time and a relatively high temperature.

Actually, an upper limit of the heat treatment temperature is considered to be determined by a thermal budget applied to a DRAM. In capacitor forming steps, about 750° C. is the upper limit, and also in the heat treatment for rounding the edge of the storage electrode it will be preferable to set a heat treatment temperature to be below about 750° C. at highest.

In a case where platinum film is formed of the storage electrode, the same tendency as in the case where the storage electrode is formed of ruthenium film is found. In the case where platinum film is used it is preferable that the heat treatment for rounding the edge is made in an atmosphere containing no oxygen at a temperature of about 300–750° C.

Although the inventors of the present invention have not made studies in good details, the above is considered to be the same with other metal materials.

When the heat treatment is made after the capacitor dielectric film covering the storage electrode is formed, a configurational change of the storage electrode gives physical stress to the capacitor dielectric film, with a resultant risk of contrarily increased leakage current. Accordingly, it is preferable to make the heat treatment for rounding the edge of the storage electrode is performed after the storage electrode is formed and before the capacitor dielectric film is formed.

Various modes are considered for the heat treatment which is made after the storage electrode is formed and before the capacitor dielectric film is formed.

Figure 2A:
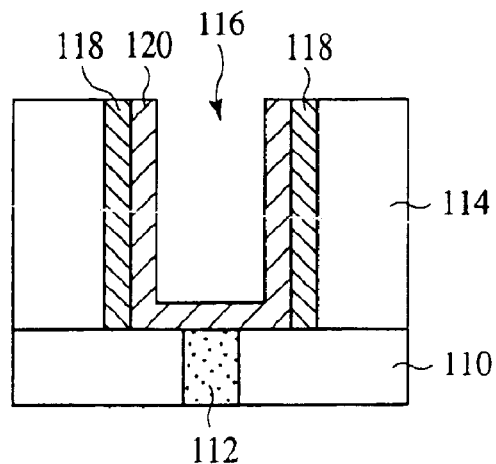
Figure 3A:
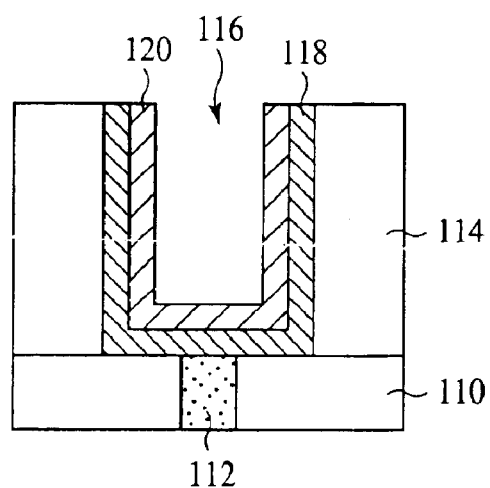

In forming the storage electrode 120 in the opening 116 formed in the inter-layer insulation film 114, following three modes can be considered. That is, a mode 1) wherein the storage electrode 120 is formed directly along the inside wall and the bottom of the opening 116 (FIG. 1A); a mode 2) wherein the storage electrode 120 is formed on the inside wall and the bottom of the opening 116 with a liner film 118 formed on the inside wall of the opening 116 interposed therebetween (FIG. 2A); and a mode 3) wherein the storage electrode 120 is formed on the inside wall and the bottom of the opening 116 with a liner film 118 formed on the inside wall and the bottom of the opening 116 interposed therebetween (FIG. 3A) can be considered. The mode 1) is applicable to a case that adhesion between the storage electrode 120 and the inter-layer insulation film 114 is relatively good, e.g., the storage electrode 120 is formed of ruthenium film containing a large oxygen content. The mode 2) is applicable to a case that adhesion between the storage electrode 120 and the inter-layer insulation film 120 is insufficient, but adhesion between the storage electrode 120 and a lower layer plug 112 is sufficient. The mode 3) is applicable to a case that adhesion between the storage electrode 120 and the inter-layer insulation film 114 and the adhesion between the storage electrode 120 and the lower layer plug 112 are both insufficient. The liner film 118 used in the specification of the present application means a film which is formed between at least the outside surface of the storage electrode 120 and the inter-layer insulation film 114 and functions to enhance physical and electric adhesion and barrier properties between the lower layer plug 112 and the storage electrode 120 and adhesion between the inter-layer insulation film 114 and the storage electrode 120, and in the cylindrical capacitor, functions as a support member for supporting the storage electrode 120.

Figure 2B:
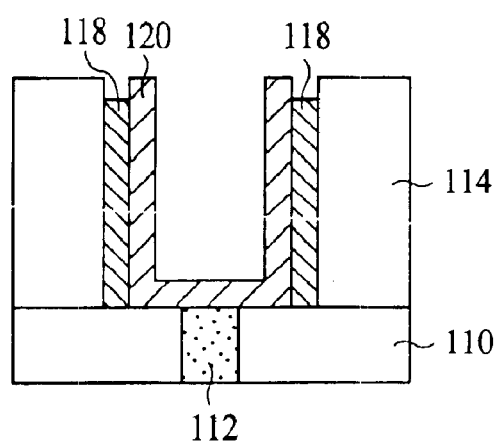
Figure 3B:
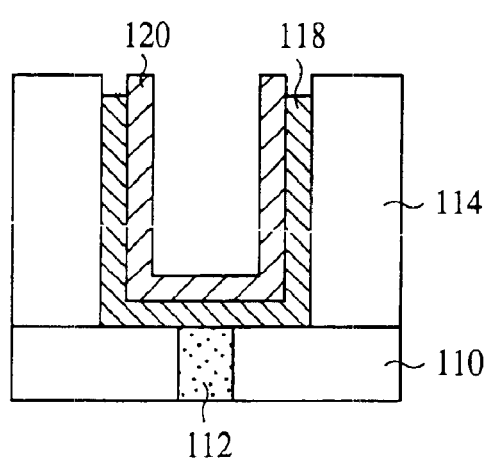

In the modes that the liner film 118 is provided, when the adhesion between the liner film 118 and the storage electrode 120 is strong, the storage electrode 120 cannot undergo a sufficient configurational change on a side nearer the liner film 118. In view of this, it is preferable that the upper end of the liner film 118 is etched to an extent that causes no change to a configuration of the major part of the storage electrode 120 (FIG. 2B, FIG. 3B). Thus, configurational changes in the upper end of the storage electrode 120 are not restricted by the liner film 118. The upper end of the liner film 118 is etched, whereby the upper end of the storage electrode 120 can be made into a configuration which is substantially spherical, and the electric field concentration and leakage current reduction can be expected.

Figure 1B:
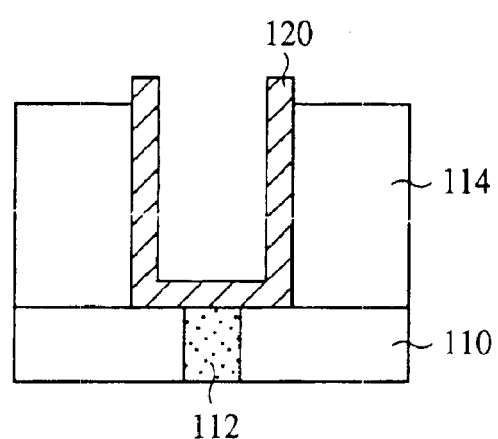

Even in the case that the liner film 118 is not provided, when adhesion between the inter-layer insulation film 114 and the storage electrode 120 is strong, as is the liner film 114, the surface of the inter-layer insulation film 114 is a slightly etched, whereby the same effects can be obtained (FIG. 1B).

Figure 1C:
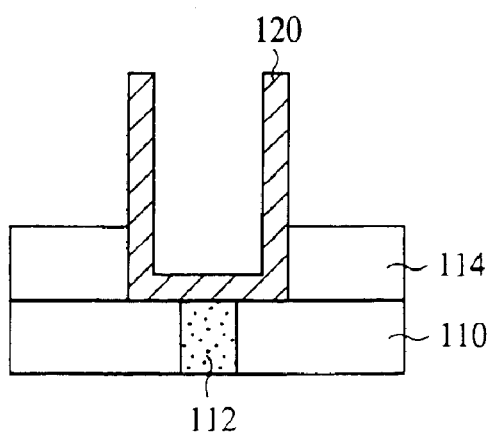
Figure 2C:
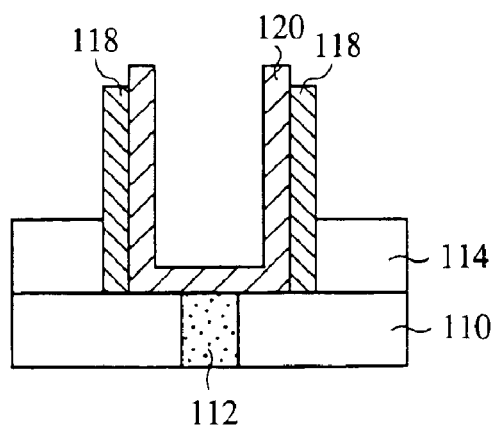
Figure 2D:
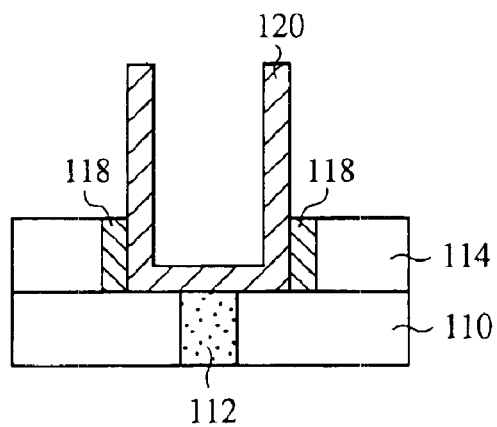
Figure 3C:
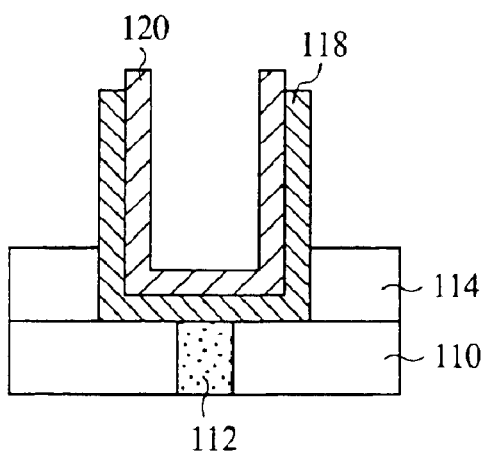
Figure 3D:
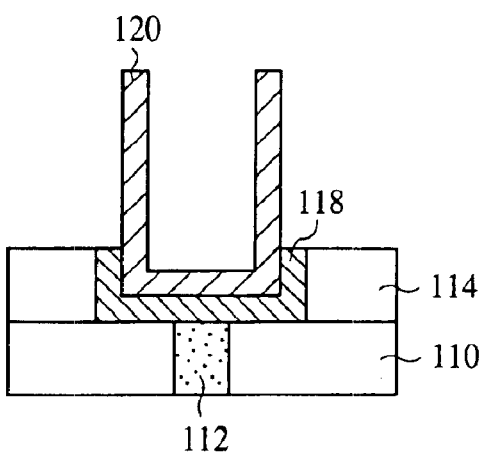

For the cylindrical capacitor, the heat treatment may be made after the inter-layer insulation film 114 and the liner film 118 are removed, and the outside surface of the storage electrode 120 is exposed (FIG. 1C, FIG. 2D, FIG. 3D). However, preferably the liner film 118 is used as a support member for supporting the storage electrode 120 when the storage electrode 120 is so high that the heat treatment causes a large configurational change to a configuration of the storage electrode 120. In this case, the heat treatment is made with the liner film 118 etched to an extent that does not affect a configurational change of the storage electrode 120 (FIG. 2C, FIG. 3C), and then the liner film remaining on the outside surface is removed (FIG. 2D, FIG. 3D).

An etching amount of the upper end of the liner film 118 is preferably above 2×d when a radius of curvature of the upper end of the storage electrode 120 as heat-treated is d. An amount of the liner film 118 to be etched is thus set to thereby exactly prohibit the liner film 118 from hindering the storage electrode 120 from undergoing a configurational change. Otherwise, an etching amount of the upper end of the liner film 118 is set to be substantially equal to a half of a film thickness of the storage electrode 120, whereby the upper end alone of the storage electrode 120 can be rounded, and deformation of the major part of the electrode material can be suppressed.

The heat treatment is not made essentially in one step and may be made in a plurality of steps. For example, the heat treatment may be made in the step shown in FIG. 3C and then again in the step shown in FIG. 3D.

Various configurations of the storage electrode 120 after heated treatment are formed depending on the absence or presence of the liner film 118, the absence or presence of an etching of the upper end of the liner film 118, amounts of the etching of the liner film 118, processes of the heat treatment, temperatures of the heat treatment, configurations of the storage electrode 120 before heat treatment, etc. Configurations of the storage electrode 120 heat treated under typical conditions are as exemplified below.

Figure 4A:
FIGS. 4A–4H are views of configurations of the upper ends of the storage electrodes after the heat treatment.
Figure 4B:
Figure 4C:

In the case where the liner film 118 is not formed or in the case where the liner film 118 is formed but the upper end thereof is not etched, a configuration of the storage electrode is determined by adhesion between the inter-layer insulation film 114 and the storage electrode 120. When the adhesion is insufficient, as shown in FIGS. 4A and 4B, the edge of the upper end of the storage electrode is rounded. When the adhesion is strong, as shown in FIG. 4C, a configuration change on the side nearer the inter-layer insulation film 114 is restricted, and only the edge on the inner side is rounded.

Figure 4D:
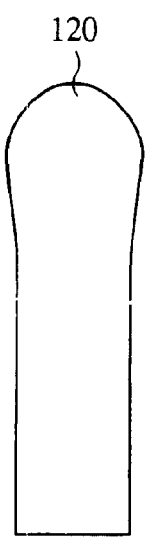
Figure 4E:
Figure 4F:
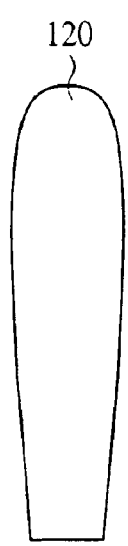

In the case where the heat treatment is made with the upper end of the liner film 118 is etched by an thickness of the storage electrode 120, a curvature radius of the upper end is about a half the thickness of the storage electrode 120 before the heat treatment. As shown in FIG. 4A, the storage electrode 120 has the edge of the upper end rounded. In the case where the heat treatment is made with the upper end of the liner film 118 etched by more than a thickness of the storage electrode 120 from a surface side of the inter-layer insulation film 114, a curvature radius of the upper end of the storage electrode 120 is larger than an about half of the thickness of the storage electrode 120 before the heat treatment. As shown in FIG. 4D, the storage electrode 120 has the upper end rounded and made thicker than the rest part. In the case where the heat treatment is made with the liner film 118 more removed, exposing an outside surface of the storage electrode 120, as shown in FIG. 4F, the thickness of the storage electrode 120 is gradually increased toward to the upper end. In the case where the thickness of the storage electrode 120 before the heat treatment is gradually decreased toward to the upper end, the storage electrode 120 below the upper end portion is constricted (FIG. 4E).

Figure 4G:
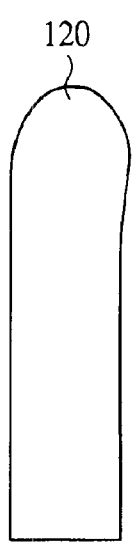
Figure 4H:
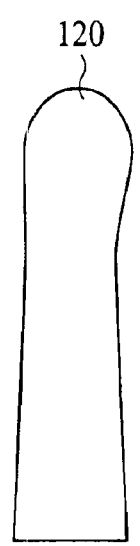

Depending on the taper angles, as shown in FIGS. 4G and 4H, the storage electrode 120 has the upper end tilted inward.

Figure 5:
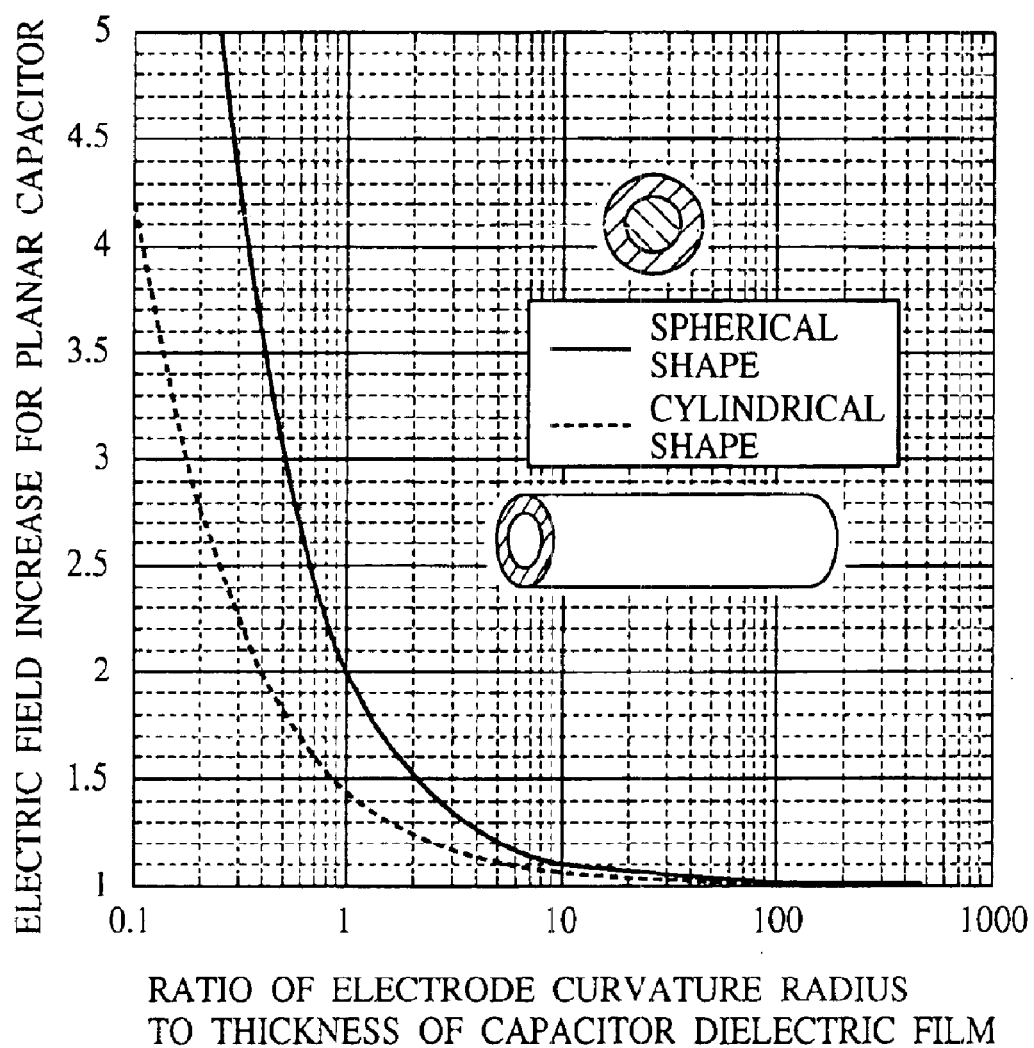
FIG. 5 is a graph of results of a logic computation of influences of ratios of curvature radii of the electrodes to film thicknesses of the capacitor dielectric film on electric field concentration.

FIG. 5 is a graph of the result of a theoretical computation of influence of ratios of curvature radii of the storage electrode to film thicknesses of the capacitor dielectric film on electric field concentration. In the graph, the dotted line indicates the result of the cylindrical capacitor which the side surfaces of the storage electrode alone is used as the effective electrode face, and the solid line indicates the result of the spherical capacitor. The region between the solid line and the dotted line indicates the result of the cylindrical capacitor.

Capacitors including the high dielectric constant film used in micronized structures, such as DRAMs, have a film thickness of the capacitor dielectric film which is about a half a film thickness of the storage electrodes and have the upper ends formed in a substantially spherical configuration, whereby a ratio of a curvature radius of the electrodes to the film thickness of the capacitor dielectric film is about 1. Accordingly, as shown by FIG. 5, the upper end has the edge rounded in a substantially spherical configuration, whereby electric field concentration can be suppressed to about 1.5–2 times that on the flat portions. In the case of the configuration having the upper end rounded in a spherical and made thicker than the rest part as shown in FIG. 4D, a ratio of a curvature radius of the electrode to a film thickness of the capacitor dielectric film can be made larger, whereby the electric field concentration can be further suppressed.

Figure 6:
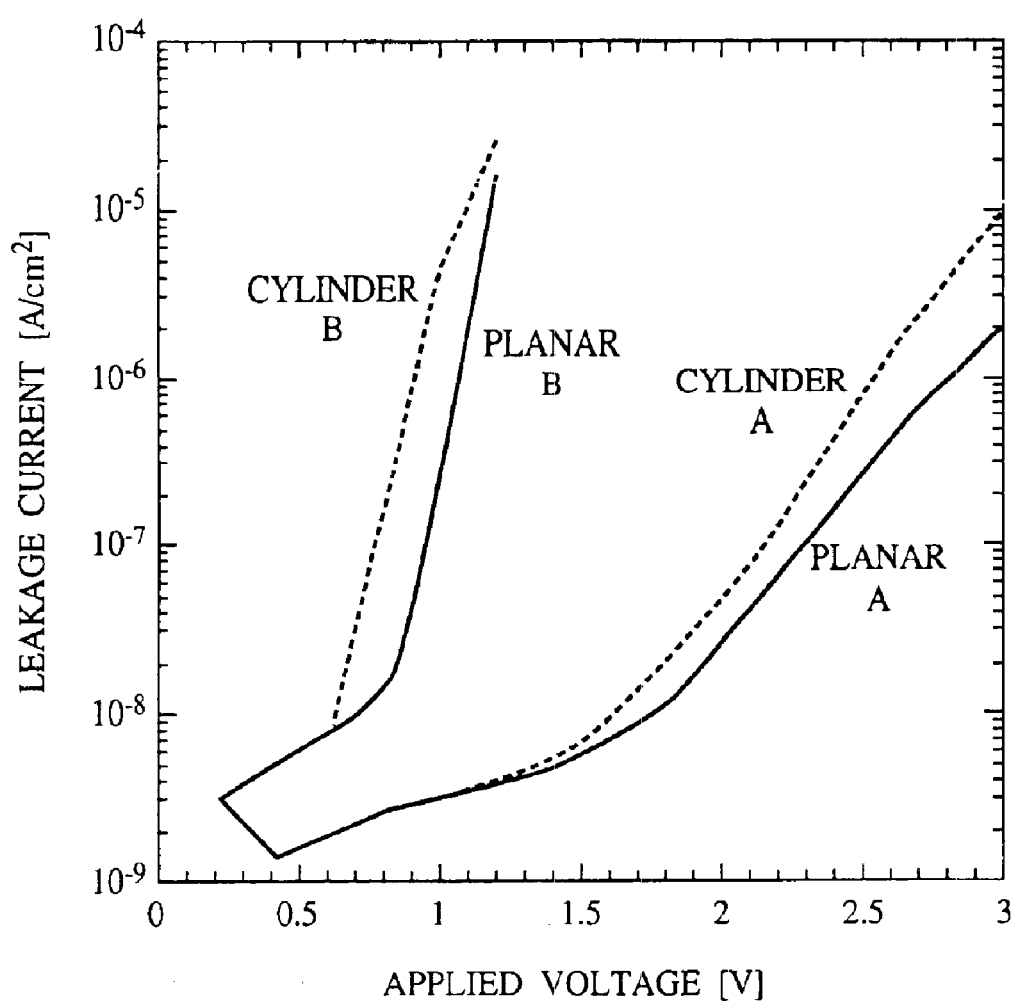
FIG. 6 is a graph of leakage currents of the cylindrical capacitor estimated based on actually measured values of leakage current of the planar capacitor.

FIG. 6 shows estimated leakage current of the cylindrical capacitor based on actually measured values of leakage current of the planar capacitor. As shown in FIG. 6, it is found that the leakage current increases due to the electric field concentration effect alone by simply changing the planar capacitor to the cylindrical capacitor. Accordingly it is found important to the cylindrical capacitor how to increase a ratio of a curvature radius of the storage electrode to a film thickness of the capacitor dielectric film.

Figure 7A:
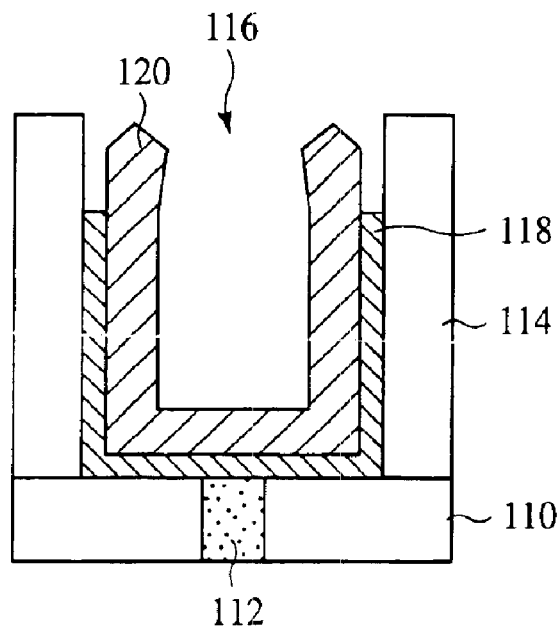
FIGS. 7A and 7B are views explaining effects produced by tapering the opening.
Figure 7B:
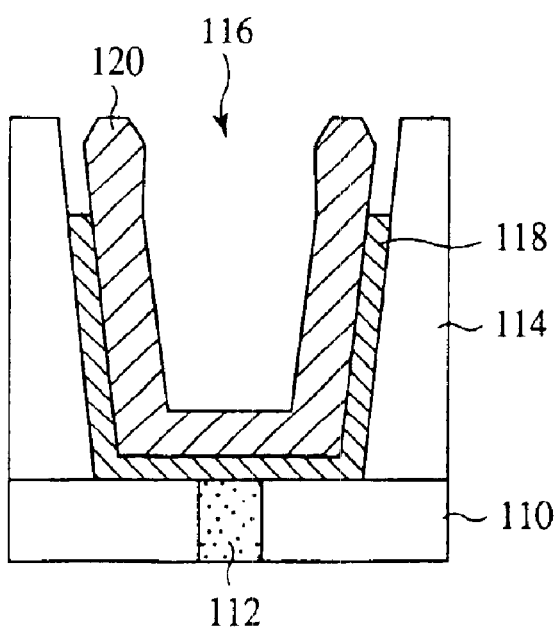

As described above, the configuration having a substantially spherical shape as shown in FIG. 4D, which has the upper end formed in a substantially spherical shape of a larger diameter than a thickness of the storage electrode 120, has very high effect of suppressing the electric field concentration. On the other hand, as shown in FIG. 7A, there is a risk that the opening 116 may have a decreased bore, which will make it difficult to form the capacitor dielectric film and the plate electrode. In such case, as shown in FIG. 7B, the opening 116 formed in the inter-layer insulation film 114 is tapered, whereby the bore is prevented from being decreased by the upper ends of the storage electrode 120 made thicker than the rest part.

The inventors of the present invention have confirmed that the heat treatment made after the storage electrode has been formed tilts the storage electrode 120 toward the inside surface. Accordingly, it will be preferable to taper the opening 116 in forming the storage electrode 120. The opening 116 is tapered, whereby the side wall of the storage electrode 120 after the heat treatment can be formed substantially vertical.

A too large taper angle makes it impossible to make the storage electrode 120 sufficiently high. A taper angle of about 1° is preferable. It is preferable to set a taper angle at below 4° at largest.

[A First Embodiment]

The semiconductor device and the method for fabricating the same according to a first embodiment of the present invention will be explained with reference to FIGS. 8, 9, 10A–10D, 11A–11C, 12A–12D, 13A–13C, 14A–14B, 15A–15B, 16A–16B, 17A–17B, and 18.

Figure 8:
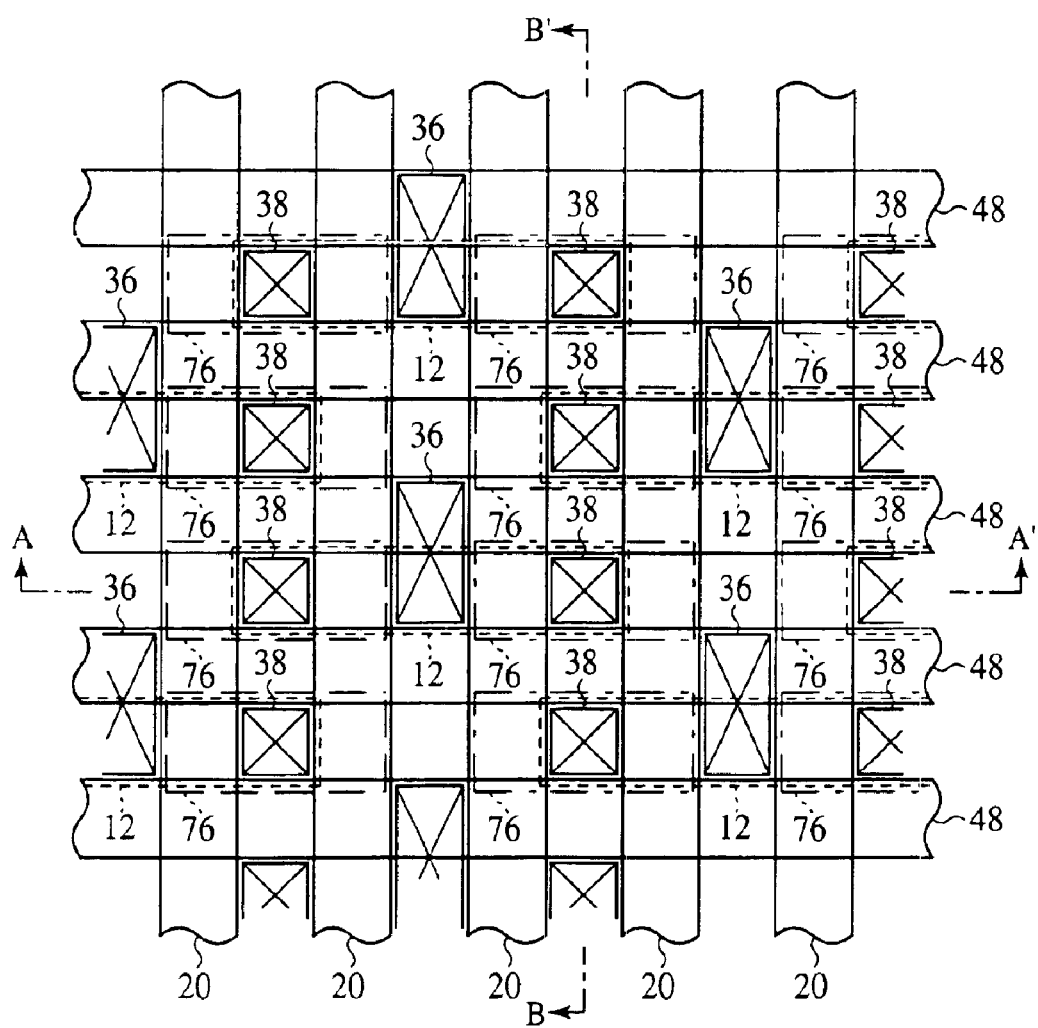
FIG. 8 is a plan view of the semiconductor device according to a first embodiment of the present invention, which shows a structure thereof.
Figure 9:
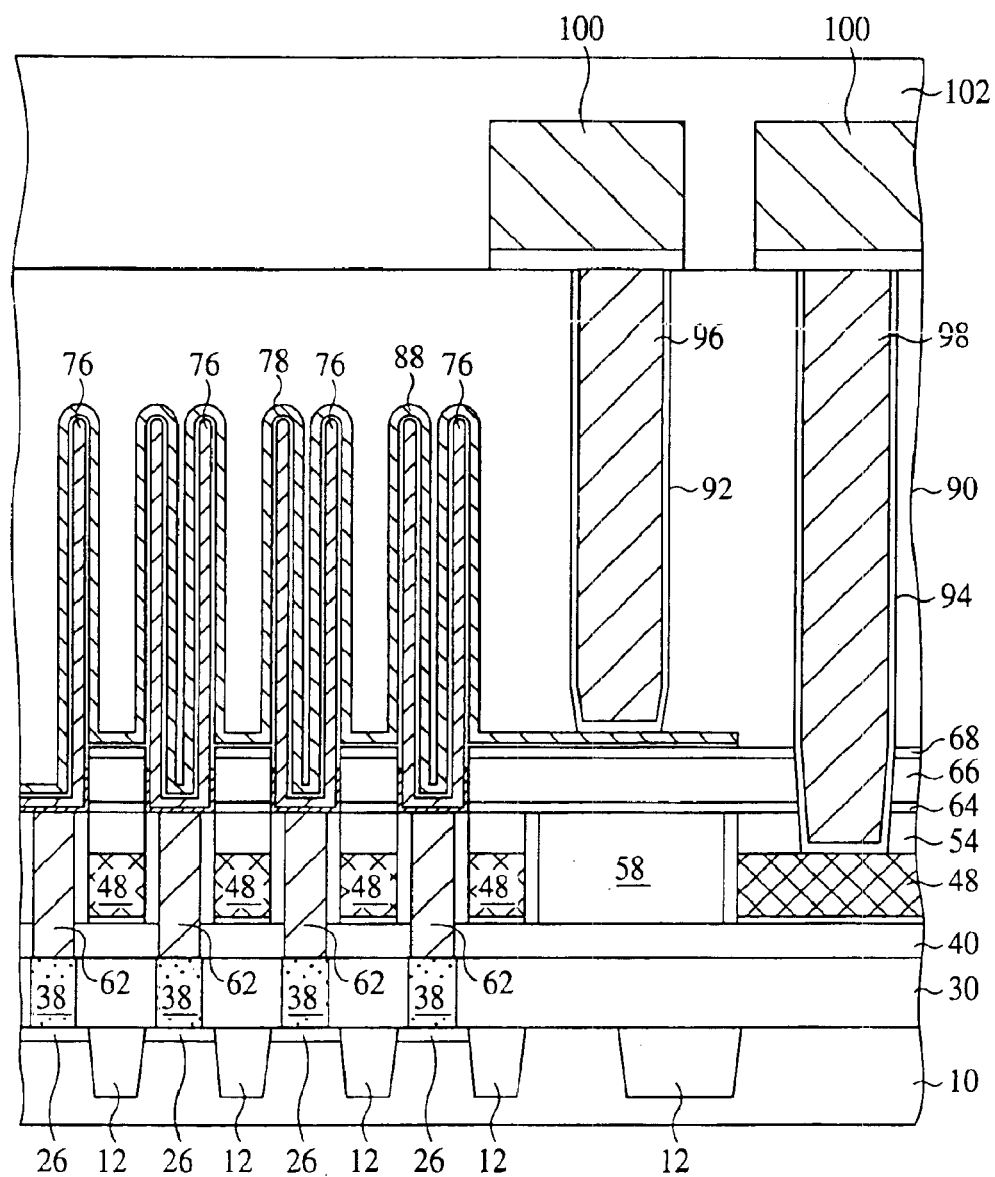
FIG. 9 is a diagrammatic sectional view of the semiconductor device according to the first embodiment of the present invention, which shows the structure thereof.

FIG. 8 is a plan view of the semiconductor device according to the present embodiment, which shows a structure thereof. FIG. 9 is a diagrammatic sectional view of the semiconductor device according to the present embodiment, which shows the structure thereof. FIGS. 10A–10D, 11A–11C, 12A–12D, 13A–13C, 14A–14B, 15A–15B, 16A–16B, 17A–17B, and 18 are sectional views of the semiconductor device according to the present embodiment in the steps of the method for fabricating the same, which show the method.

First, the structure of the semiconductor device according to the present embodiment will be explained with reference to FIGS. 8 and 9. FIG. 9 is a diagrammatic sectional view of the semiconductor device along the line B–B' in FIG. 8.

A device isolation film 12 for defining device regions is formed on a silicon substrate 10. In respective device regions, memory cell transistors each comprising a gate electrode 20 and source/drain diffused layers 24, 26 are formed. The gate electrode 20 also functions as a conducting film which works as a word line. An inter-layer insulation film 30 with plugs 36 connected to the source/drain diffused layer 24 and the plugs 38 connected to the source/drain diffused layer 26 buried in is formed on the silicon substrate 10 with the memory cell transistors formed thereon.

An inter-layer insulation film 40 is formed on the inter-layer insulation film 30. Bit lines 48 connected to the source/drain diffused layer 24 via the plugs 36 are formed on the inter-layer insulation film 40. As shown in FIG. 8, a plurality of the bit lines 48 are extended, intersecting the word lines (gate electrodes 20). An inter-layer insulation film 58 is formed on the inter-layer insulation film 40 with the bit lines 48 formed on. Plugs 62 connected to the plugs 38 are buried in the inter-layer insulation film 58.

On the inter-layer insulation film 58, an etching stopper film 64, an inter-layer insulation film 66 and an etching stopper film 68 are formed. Cylindrical storage electrodes 76 are formed to project above the etching stopper film 68, passed through the etching stopper film 68, the inter-layer insulation film 66 and the etching stopper film 64, and connected to the plug 62. The upper ends of the storage electrodes 76 have the edges rounded in a substantially spherical configuration. Plate electrodes 88 are formed on the storage electrode 76 with a capacitor dielectric film 78 interposed therebetween.

An inter-layer insulation film 90 is formed on the plate electrodes 88. Interconnections 100 are formed on the inter-layer insulation film 90, connected to the plate electrodes 88 through the plugs 96 or connected to the bit lines 48 through the plugs 98. An inter-layer insulation film 102 is formed on the inter-layer insulation film 90 with the interconnections 100 formed on.

Thus, a DRAM comprising memory cells each including one transistor and one capacitor is formed.

As described above, the semiconductor device according to the present embodiment is characterized mainly in that the cylindrical capacitor has the storage electrode 76 having the edge of the upper end rounded in a substantially spherical configuration. The semiconductor device has such structure, whereby electric filed concentration on the upper end of the storage electrodes 76 is mitigated to thereby preclude leakage current increase and dielectric breakdown of the capacitor dielectric film.

Then, the method for fabricating the semiconductor device according to the present embodiment will be explained with reference to FIGS. 10A–10D, 11A–11C, 12A–12D, 13A–13C, 14A–14B, 15A–15B, 16A–16B, 17A–17B, and 18. FIGS. 10A–10D and 11A–11C are sectional views of the semiconductor device along the line B–B' in FIG. 8 in the steps of the method for fabricating the semiconductor device. FIGS. 12A–12D, 13A–13C, 14A–14B, 15A–15B, 16A–16B, 17A–17B, and 18 are sectional views of the semiconductor device along the line B–B' in FIG. 8 in the steps of the method for fabricating the semiconductor device.

Figure 10A:
FIGS. 10A–10D, 11A–11C, 12A–12D, 13A–13C, 14A–14B, 15A–15B, 16A–16B, 17A–17B, and 18 are sectional views of the semiconductor device according to the first embodiment of the present invention in the steps of the method for fabricating the same, which explain the method.

First, the device isolation film 12 is formed on the main surface of the a silicon substrate 10 by, e.g., STI (Shallow Trench Isolation) method (FIG. 10A). Specifically, a 100 nm-thick silicon nitride film (not shown) is formed on the silicon substrate 10. Then, the silicon nitride film is patterned, left in regions which are to be element regions. Then, with the patterned silicon nitride film as a hard mask, the silicon substrate 10 is etched to form a device isolation trench of, e.g., a 200 nm-depth in the silicon substrate 10. Next, a silicon oxide film is deposited on the entire surface by, e.g., CVD (Chemical Vapor Deposition) method, and the silicon oxide film is polished by CMP (Chemical Mechanical Polishing) method until the silicon nitride film is exposed to leave the silicon oxide film selectively in the device isolation trench. Then, the silicon nitride film is removed to form the device isolation film 12 of the silicon oxide film buried in the device isolation trench in the silicon substrate 10.

Then, P-well (not shown) are formed in the silicon substrate 10 in the memory cell region, and the ion implantation for controlling the threshold voltage is conducted.

Then, on a plurality of device regions 10 defined by the device isolation film 12, a gate insulation film 14 of, e.g., a 5 nm-thick silicon oxide film are formed by, e.g., thermal oxidation method. The gate insulation film 14 may be another insulation film of silicon oxynitride film or others.

Figure 10B:
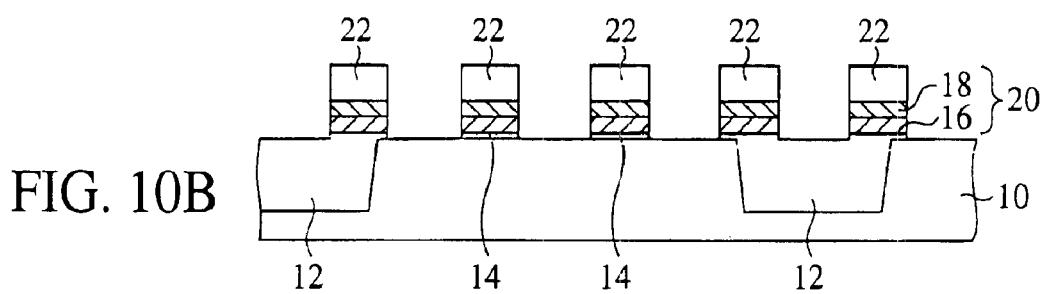

Next, gate electrodes 20 of a polymetal structure of a layer film of, e.g., polycrystalline silicon film 16 and a tungsten film 18 are formed on the gate insulation film 14 (FIG. 10B). For example, a 70 nm-thick polycrystalline silicon film 16, a 5 nm-thick tungsten nitride (WN) film (not shown), a 40 nm-thick tungsten film 18 and a 200 nm-thick silicon nitride film 22 are sequentially deposited and patterned in the same configuration by lithography and etching to form the gate electrodes 20 of the polymetal structure having the upper surface covered with the silicon nitride film 22, and including the polycrystalline silicon film 16 and the tungsten film 18 laid the latter on the former with the tungsten nitride film interposed therebetween. The gate electrodes 20 do not have essentially the polymetal structure and may have a polycrystalline silicon gate structure, polycide gate structure or a metal gate structure or others.

Then, with the gate electrodes 20 as a mask, ions are implanted to form the source/drain diffused layers 24, 26 in the silicon substrate 10 on both sides of the gate electrodes 20.

Thus, memory cell transistors each comprising the gate electrodes 20 and the source/drain diffused layers 24, 26 are formed on the silicon substrate 10.

Figure 10C:
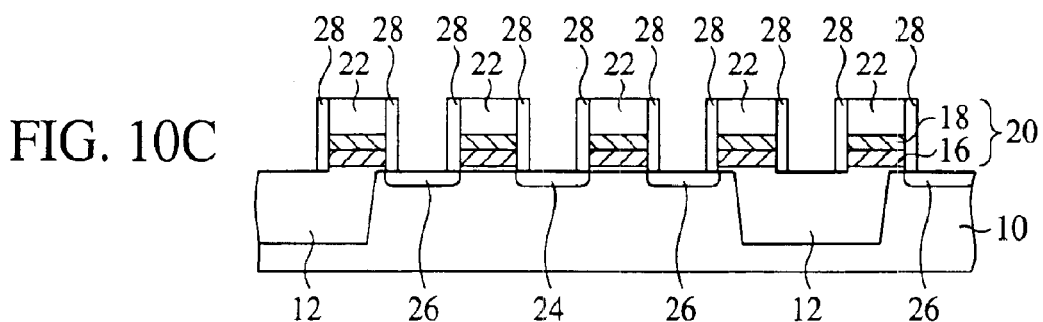
Figure 12A:
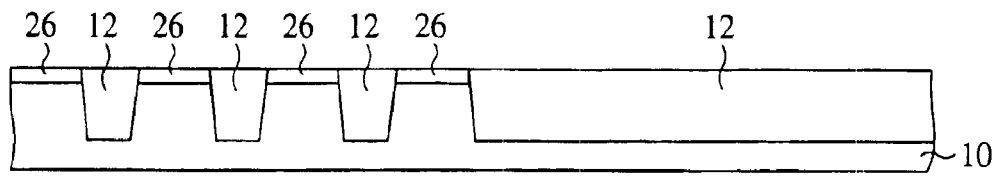

Next, a 35 nm-thick silicon nitride film, for example, is deposited on the entire surface by, e.g., CVD method and etched back to form a sidewall insulation film 28 of the silicon nitride film on the side walls of the gate electrodes 20 and the silicon nitride film 22 (FIG. 10C, FIG. 12A).

Then, a BPSG film, for example, is deposited on the entire surface by, e.g., CVD method, and the surface of the BPSG film is reflowed and polished by reflow method and CMP method until the silicon nitride film 22 is exposed to form the inter-layer insulation film 30 of the BPSG film having the surface planarized.

Figure 10D:
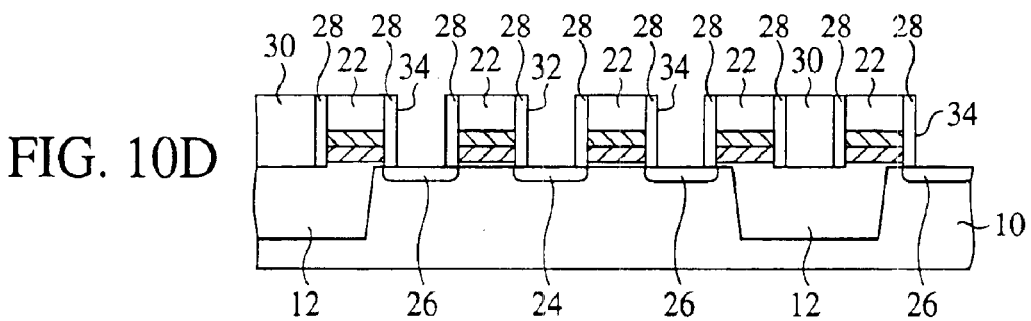
Figure 12B:
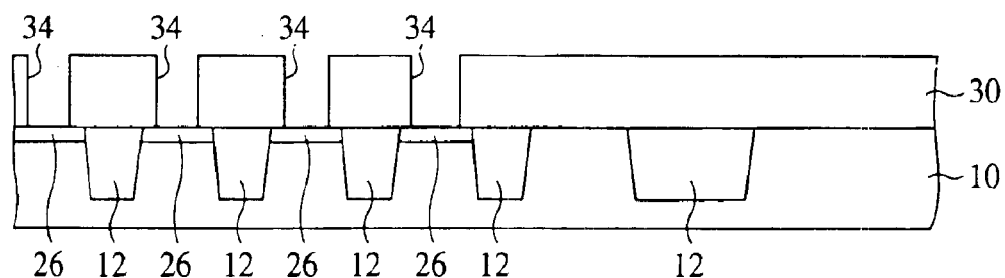

Next, contact holes 32 reaching the source/drain diffused layer 24 and the contact holes 34 reaching the source/drain diffused layer 26 are formed in the inter-layer insulation film 30 by lithography and etching by self-alignment with the gate electrodes 20 and the sidewall insulation film 28 (FIG. 10D, FIG. 12B).

Figure 11A:
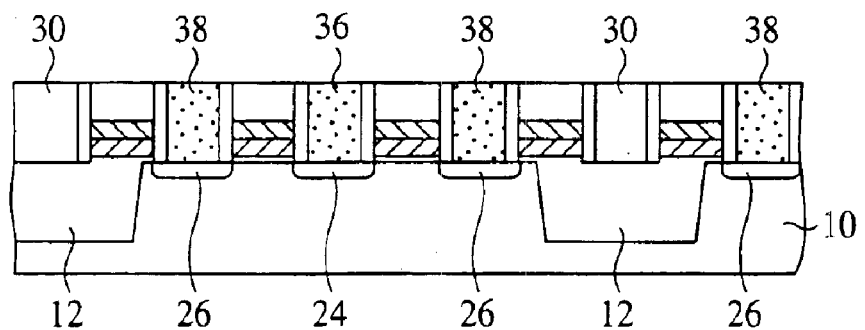
Figure 12C:
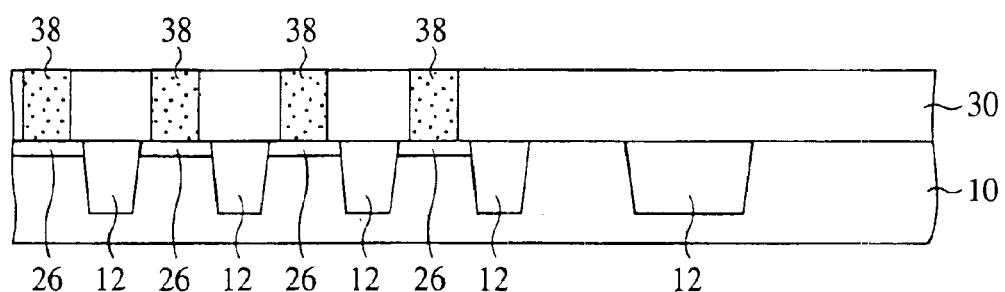

Then, the plugs 36 and the plugs 38 are buried respectively in the contact holes 32 and the contact holes 34 opened in the inter-layer insulation film 30 (FIG. 11A, FIG. 12C). For example, phosphorus-doped polycrystalline silicon film is deposited by CVD method and is polished by CMP method until the silicon nitride film 22 is exposed to leave the plugs 36, 38 of the polycrystalline silicon film selectively only in the contact holes 32, 34.

Next, a 200 nm-thick silicon oxide film, for example, is deposited on the entire surface by, e.g., CVD method to form the inter-layer insulation film 40 of the silicon oxide film.

Figure 11B:
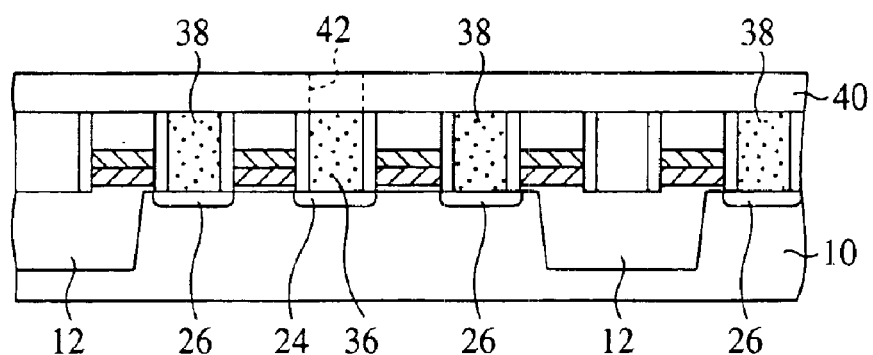
Figure 12D:
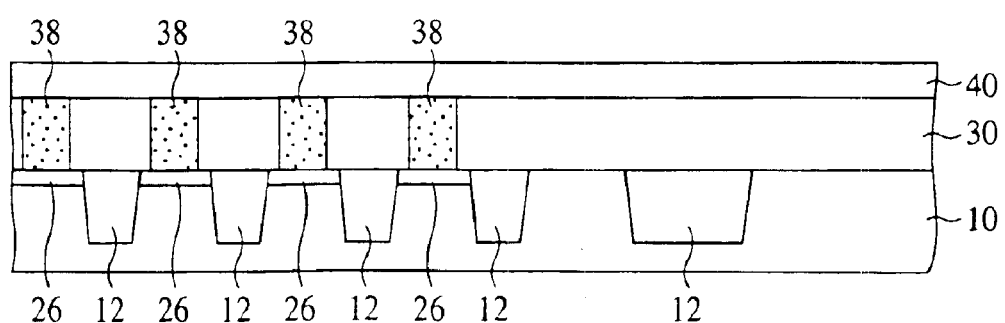

Then, the contact holes 42 reaching the plugs 36 are formed in the inter-layer insulation film 40 by lithography and etching (FIG. 11B, FIG. 12D).

Figure 11C:
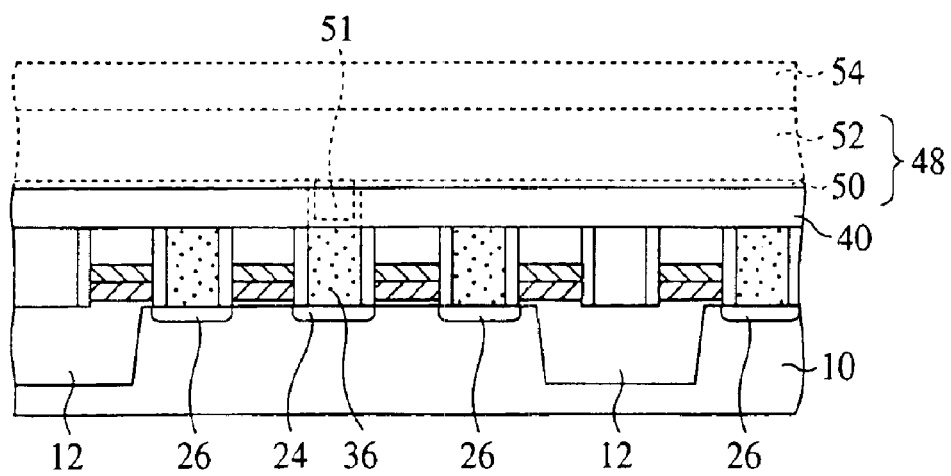
Figure 13A:
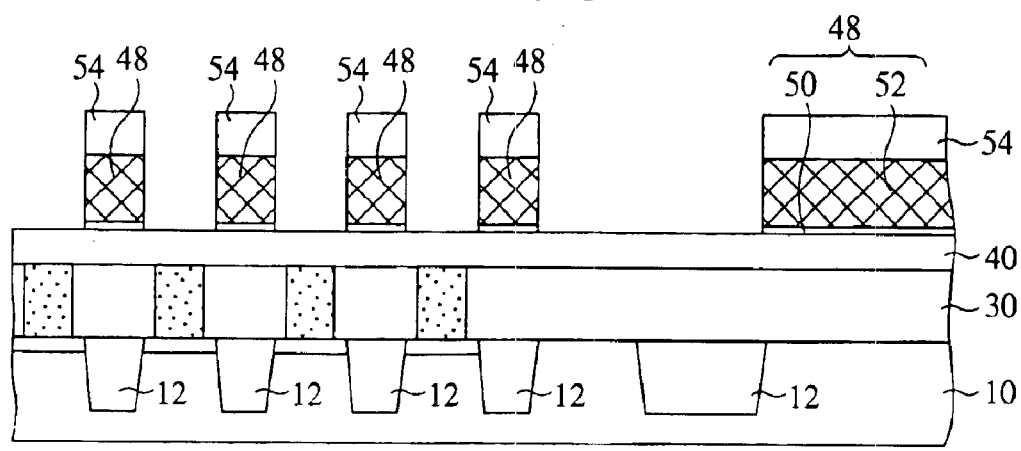

Next, the bit lines 48 connected to the plugs 36 via the contact holes 42 are formed on the inter-layer insulation film 40 (FIG. 11C, FIG. 13A). First, an adhesion layer 50 of a layer structure of a 45 nm-thick titanium nitride (TiN)/titanium (Ti), a 250 nm-thick tungsten (W) film 51 are sequentially deposited. Then, the tungsten film 51 is polished by CMP to bury plugs of the tungsten film 51 in the contact holes 42. Next, a 300 nm-thick tungsten film 52 is deposited by sputtering method. Then, a 200 nm-thick silicon nitride film 54 is deposited on the tungsten film 52 by CVD method. Next, the silicon nitride film 54, the tungsten film 52 and the adhesion layer 50 are patterned by lithography and etching to form the bit lines 48 having the upper surface covered with the silicon nitride film 54, formed of the adhesion layer 50 and the tungsten film 52 and connected to the source/drain diffused layer 24 via the plugs 36.

Figure 13B:
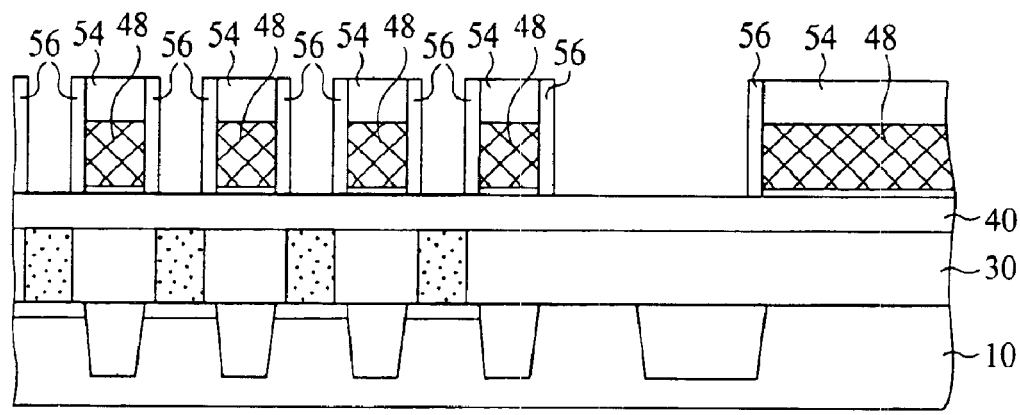

Next, a 20 nm-thick silicon nitride film, for example, is deposited on the entire surface by, e.g., CVD method and etched back to form the sidewall insulation film 56 of the silicon nitride film on the side walls of the bit lines 48 and the silicon nitride film 54 (FIG. 13B).

Then, a 400 nm-thick silicon oxide film, for example, is deposited on the entire surface by, e.g., CVD method, and the surface of the silicon oxide film is polished by CMP method to form the inter-layer insulation film 58 of the silicon oxide film having the surface planarized.

Figure 13C:
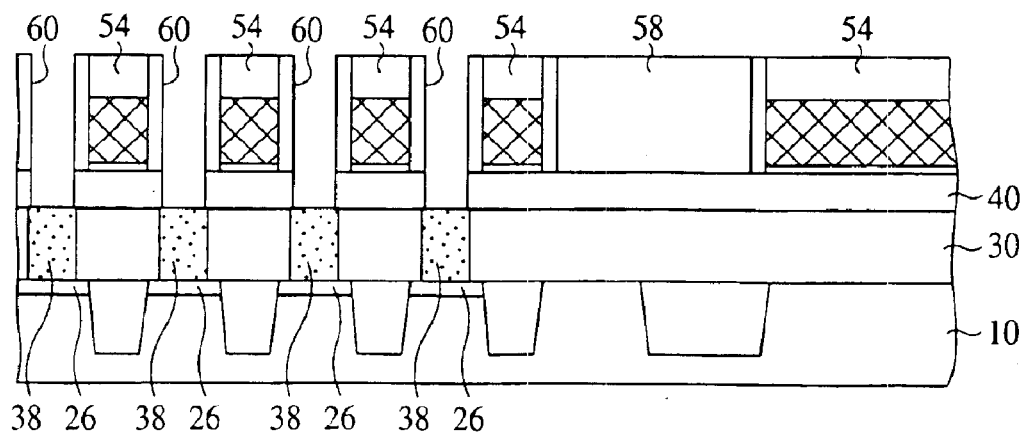

Then, contact holes 60 reaching the plugs 38 are formed in the inter-layer insulation films 58, 40 by lithography and etching (FIG. 13C). At this time, the silicon oxide film is etched under etching conditions providing a high selective ratio to the silicon nitride film to thereby open the contact holes 60 by self-alignment with the silicon nitride film 54 covering the upper surfaces of the bit lines and the sidewall insulation film 56 formed on the side walls of the bit lines 48.

Figure 14A:
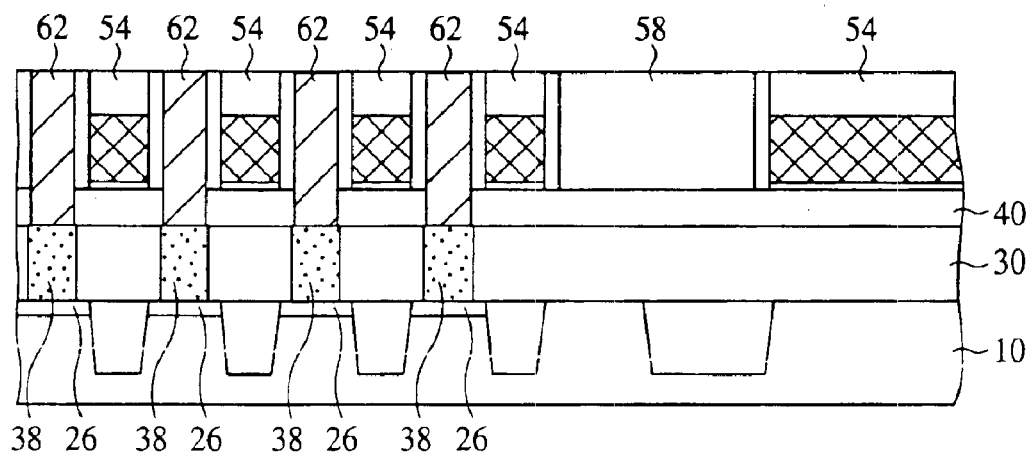

Next, an adhesion layer of a 25 nm-thick layer film of titanium nitride/titanium, and a 250 nm-thick tungsten film are deposited by sputtering method and then are polished by CMP method until the surface of the inter-layer insulation film 58 is exposed to form the plugs 62 buried in the contact holes 60 (FIG. 14A).

Then, an about 40 nm-thick silicon nitride film, for example, is deposited on the entire surface by, e.g., CVD method to form an etching stopper film 64 of the silicon nitride film.

Next, a 100 nm-thick silicon oxide film, for example, is deposited on the etching stopper film 64 by, e.g., CVD method to form the inter-layer insulation film 66 of the silicon oxide film.

Then, an about 40 nm-thick silicon nitride film, for example, is deposited on the inter-layer insulation film 66 by, e.g., CVD method to form an etching stopper film 68 of the silicon nitride film.

Figure 14B:
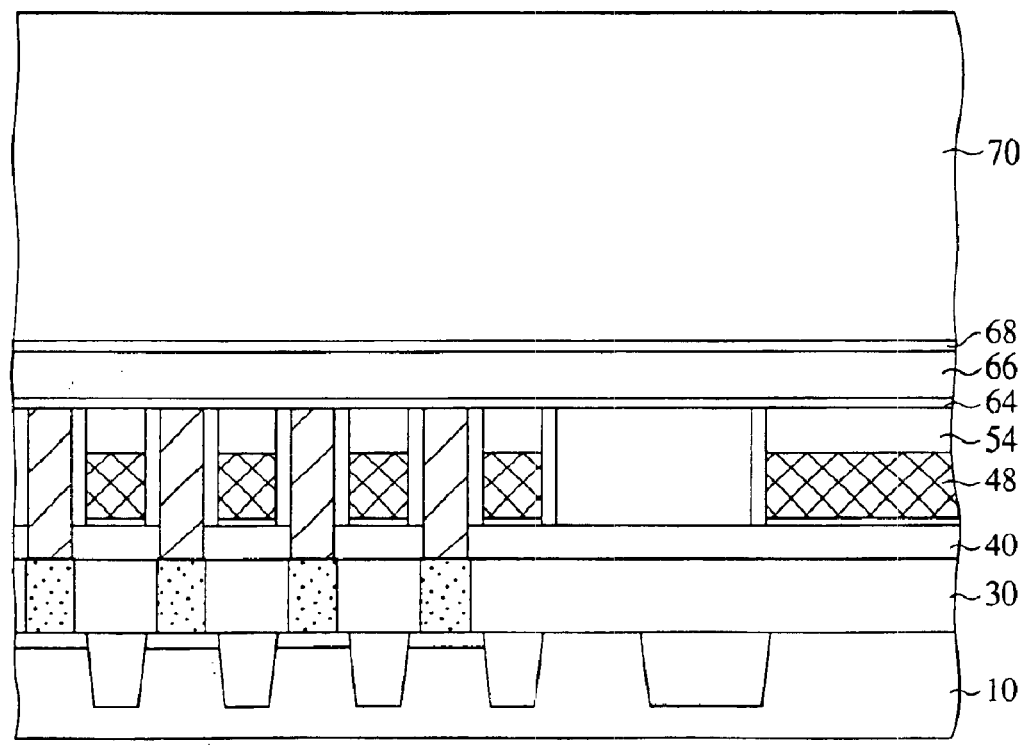

Next, a 600 nm-thick silicon oxide film, for example, is deposited on the etching stopper film 68 by, e.g., CVD method to form the inter-layer insulation film 70 of the silicon oxide film (FIG. 14B).

Figure 15A:
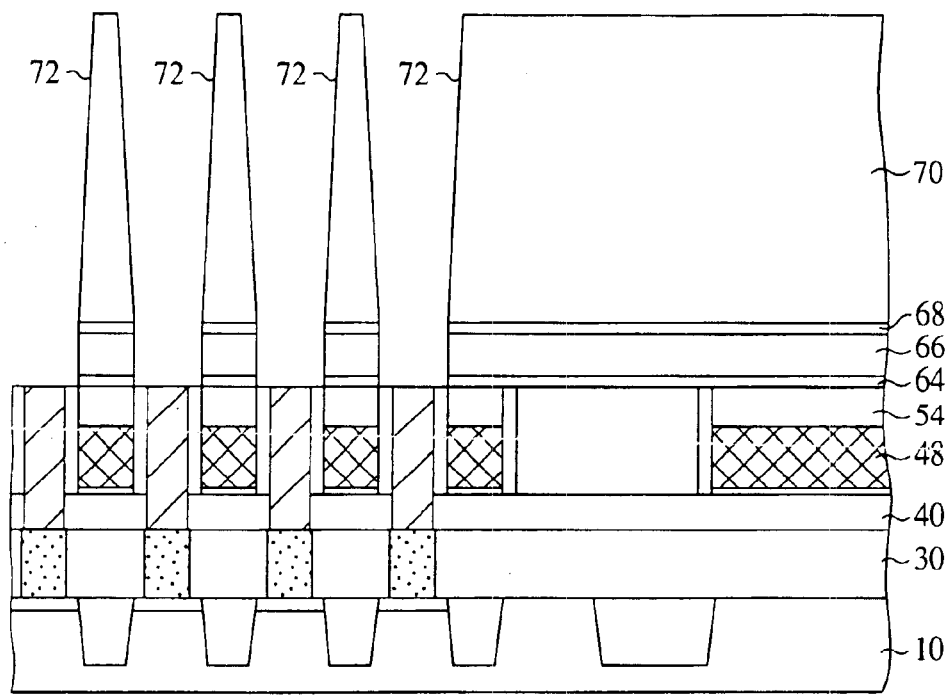

The inter-layer insulation film 70, the etching stopper film 68, the inter-layer insulation film 66 and the etching stopper film 64 are patterned by lithography and etching to form, in regions for the storage electrodes to be formed in, openings 72 passed through said films down to the plugs 62 (FIG. 15A). Said films are patterned so that the side walls of the openings 72 can be tapered by, e.g., about 3°.

Next, a 10 nm-thick titanium nitride film is deposited on the entire surface by, e.g., CVD method.

Then, a 40 nm-thick ruthenium (Ru) film is deposited on the titanium nitride film. For example, an about 10 nm-thick seed layer is formed by sputtering method, and then an about 30 nm-thick ruthenium film is deposited by CVD method to form the 40 nm-total thick ruthenium film. By CVD method, the ruthenium film is formed, for example, at 300° C. film forming temperature, under a 0.05 Torr pressure, at a 0.06 cc flow rate of $Ru(EtCp)_2$ as a ruthenium source and a 160 sccm $O_2$ gas flow rate.

Then, a photoresist film (not shown) is applied to fill the openings 72 with the titanium nitride film and ruthenium film formed in.

Figure 15B:
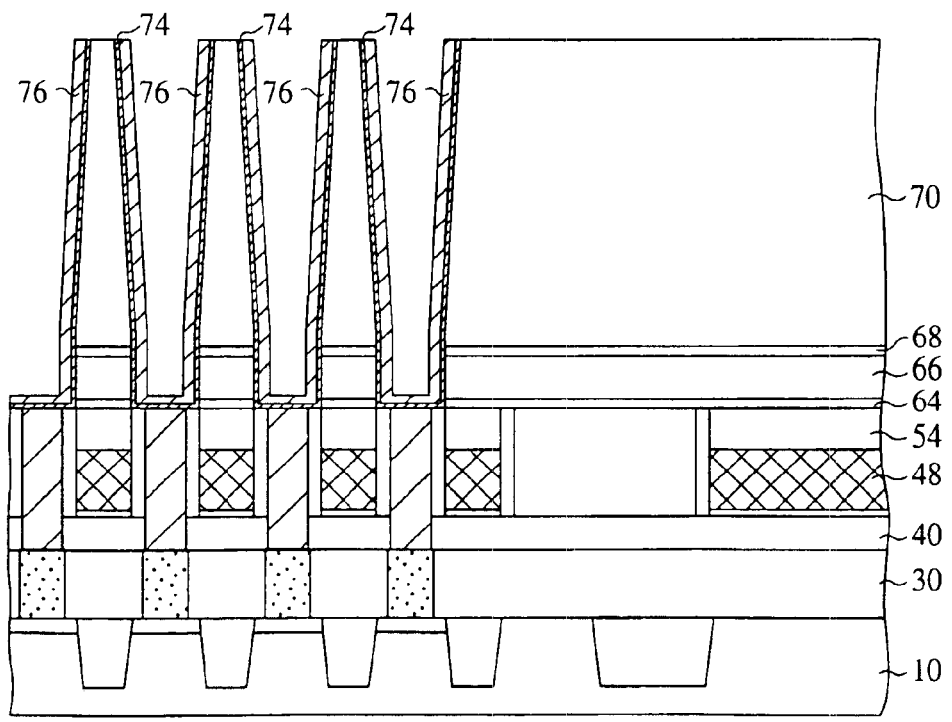

Next, the photoresist film, the ruthenium film and the titanium nitride film are polished by, e.g., CMP method until the surface of the inter-layer insulation film 70 is exposed and the photoresist film in the openings 72 are removed by reactive ion etching, to form the liner film 74 of the titanium nitride film and the storage electrodes 76 of the ruthenium film (FIG. 15B).

A conducting film forming the storage electrodes 76 is selected suitably in accordance with compatibility with the capacitor dielectric film 78, which will be formed later. For example, in a case where a dielectric film of $Ta_2O_5$ is used as the capacitor dielectric film 78, the storage electrodes 76 may be formed of ruthenium, ruthenium oxide (RuOx), tungsten, tungsten nitride, polycrystalline silicon, titanium nitride or others. In a case where the capacitor dielectric film 78 is formed of a dielectric film of BST ($BaSrTiO_x$) or ST ($SrTiO_x$), the storage electrodes 78 can be formed of platinum (Pt), Ru, $RuO_x$, W, SRO ($SrRuO_3$) or others. In a case where the capacitor dielectric film 74 is formed of a dielectric film of PZT, the storage electrodes 62 may be formed of Pt or others. In cases where the dielectric films of titanium oxide ($TiO_x$), alumina ($Al_2O_3$), SBT ($SrBiTiO_x$) or others are used, the storage electrodes 76 may be formed of a conducting film selected suitably in accordance with compatibility of these dielectric films.

In the present embodiment, the liner film 74 is for enhancing adhesion between the plugs 62 and the storage electrodes 76. The liner film 74 may not be formed when adhesion between the plugs 62 and the storage electrodes 76 is sufficient. The liner film 74 may be formed only on the side walls of the openings 72 as shown in FIG. 2, and in this case, the liner film may be formed of an insulation film, such as silicon nitride film, tantalum oxide film or others. The absence and presence of the liner film 74, and a material of the liner film 74 are suitably selected in consideration of adhesion to the inter-layer insulation film, the plugs 62 and the storage electrodes 76.

Figure 16A:
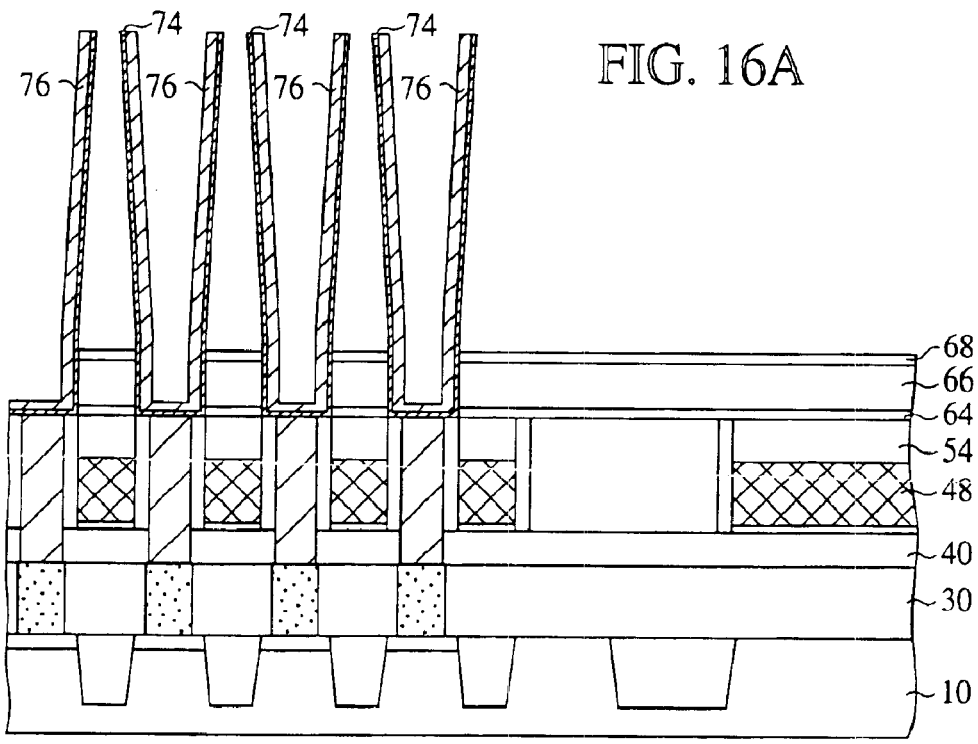

Then, with the etching stopper film 68 as a stopper, the inter-layer insulation film 70 is isotropically wet-etched selectively with, e.g., a hydrogen fluoride aqueous solution (FIG. 16A).

Figure 16B:
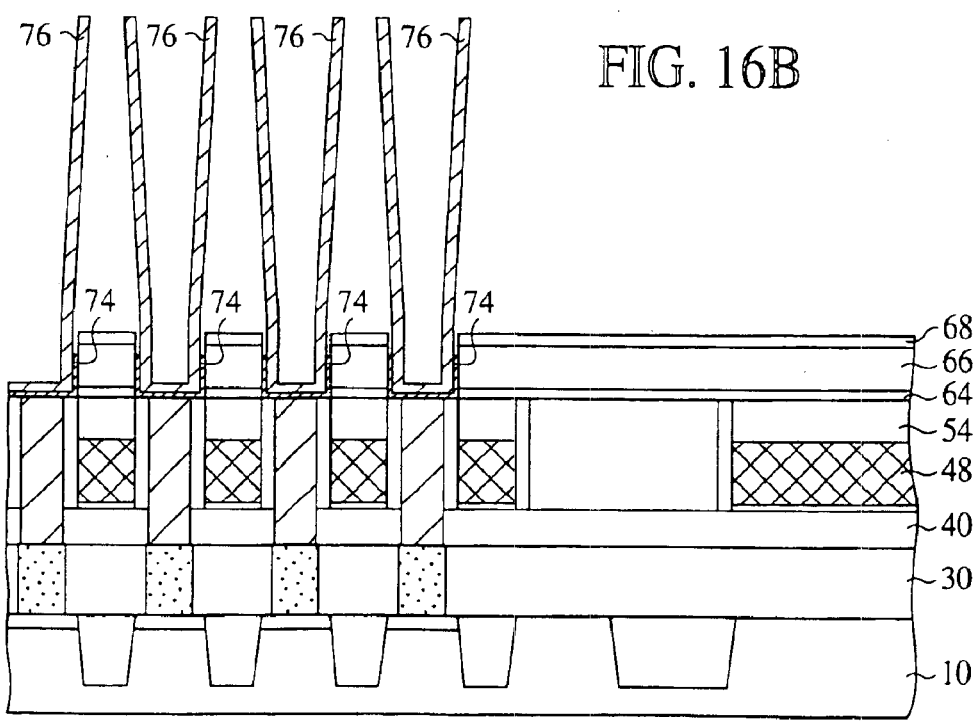

Next, the liner film 74 is etched selectively with respect to the storage electrodes 76, the etching stopper film 68 and the inter-layer insulation film 66 by using, e.g., an aqueous solution containing sulfuric acid and hydrogen peroxide (FIG. 16B). This etching considers poor compatibility between the liner film 74 and the capacitor dielectric film 78, which will be formed later. The liner film 74 may be not essentially removed when adhesion between the liner film 74 and the capacitor dielectric film 78 is good. It is preferable that the liner film 74 is etched until a gap is formed at least between the etching stopper film 68 and the storage electrodes 76. A process for removing the adhesion layer, based on compatibility with the capacitor dielectric film is detailed in the specification of Japanese Patent Application No. Hei 10-315370 (1998) filed by the Applicant of the present application.

Then, a heat treatment is performed for rounding the edges of the upper ends of the storage electrodes 76 to form the upper end of the storage electrodes in a substantially spherical configuration. The heat treatment is made, e.g., in an ambient including hydrogen and nitrogen of a 1 Torr pressure at 540° C. to reconstitute crystals of the ruthenium forming the storage electrodes 76 to thereby round the edges of the upper ends of the storage electrodes 76.

Figure 17A:
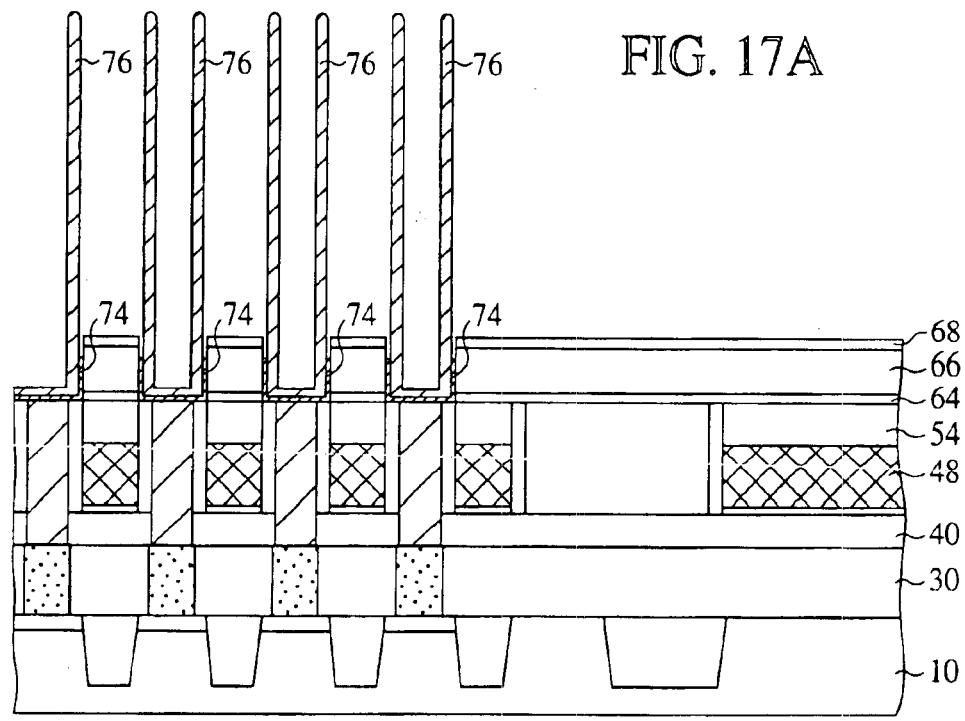

The heat treatment rounds the edges of the upper ends of the storage electrodes 76 in a substantially spherical configuration while the general configuration of the storage electrodes 76 is changed from a tapered configuration reflecting the taper angle of the opening 72 into a substantially vertical configuration (FIG. 17A).

Next, a 10–30 nm-thick $Ta_2O_5$ film or BST film, for example, is deposited on the entire surface by, e.g., CVD method to form the capacitor dielectric film 78 of the $Ta_2O5$ or BST.

Then, a 30–50 nm-thick ruthenium film, for example, is deposited on the entire surface by, e.g., CVD method to form the plate electrodes 88 of the ruthenium film. The ruthenium film is formed in the required thickness by, e.g., forming an about 10 nm-thick seed layer by sputtering method and then depositing the ruthenium film by CVD method. The film formation by CVD method is performed, for example, at a 300° C. film forming temperature, a 0.05 Torr pressure, a 0.06 cc flow rate of $Ru(EtCp)_2$ as a ruthenium source and a 160 sccm gas flow rate.

Figure 17B:
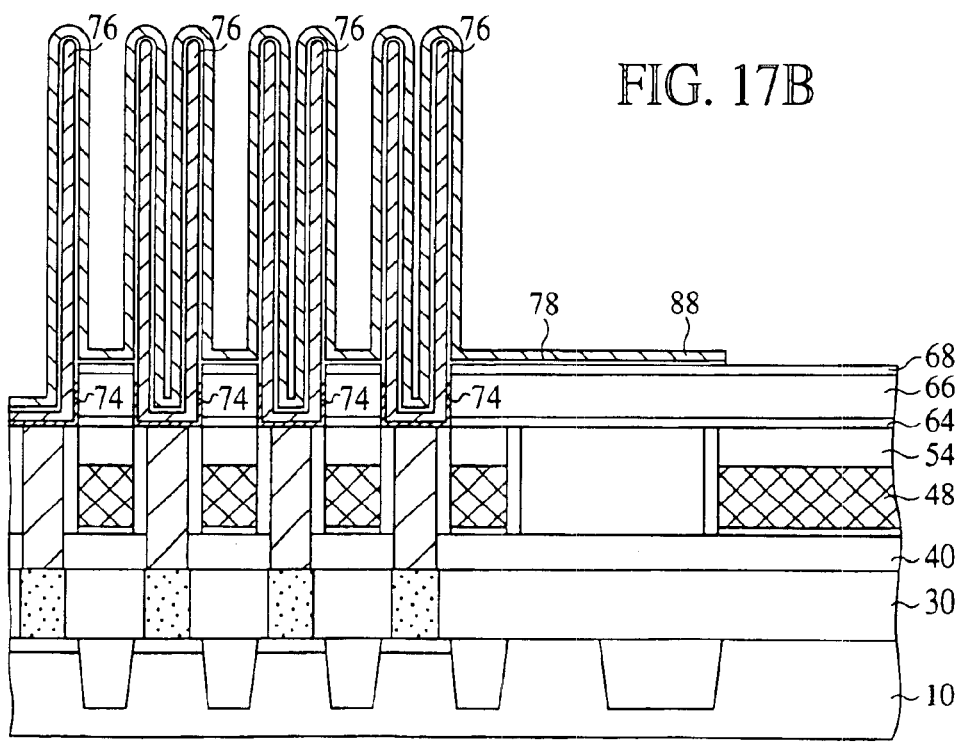

Next, the plate electrodes 88 and the capacitor dielectric film 78 are patterned by lithography and etching to remove the plate electrodes 88 and the capacitor dielectric film 78 in peripheral circuit regions (FIG. 17B).

Then, a 1000 nm-thick silicon oxide film, for example, is deposited on the entire surface by, e.g., CVD method, and the surface of the silicon oxide film is polished by CMP method to form the inter-layer insulation film 90 of the silicon oxide film having the surface planarized.

Figure 18:
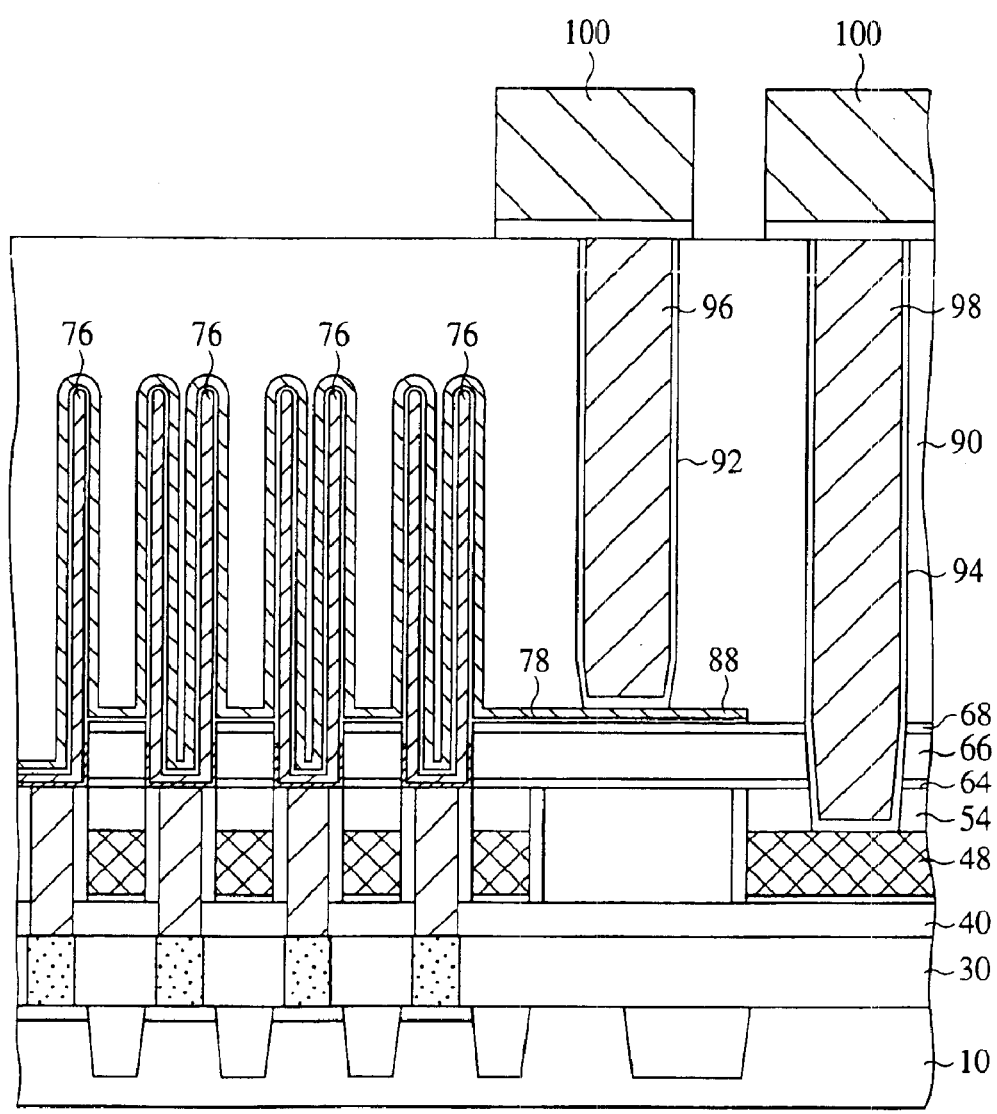

Then, the interconnections 100 are formed on the inter-layer insulation film 90, connected to the plate electrodes 88 via the plugs 96 buried in the contact holes 92 and connected to the bit lines 48 via the plugs 98 buried in the contact holes 94 (FIG. 18).

Thus, a DRAM comprising memory cells each including one transistor and one capacitor can be fabricated.

As described above, according to the present embodiment, the cylindrical capacitors comprise the storage electrodes having the upper edge rounded in a substantially spherical configuration, whereby electric field concentration on the upper end of the storage electrodes is mitigated, and leakage current increase and dielectric breakdown of the capacitor dielectric film can be precluded.

[A Second Embodiment]

The semiconductor device and the method for fabricating the same according to a second embodiment of the present invention will be explained with reference to FIGS. 19, 20A–20B, 21A–21B, and 22. The same members of the present embodiment as those of the semiconductor device and the method for fabricating the same according to the first embodiment are represented by the same reference numbers not to repeat or to simplify their explanation.

Figure 19:
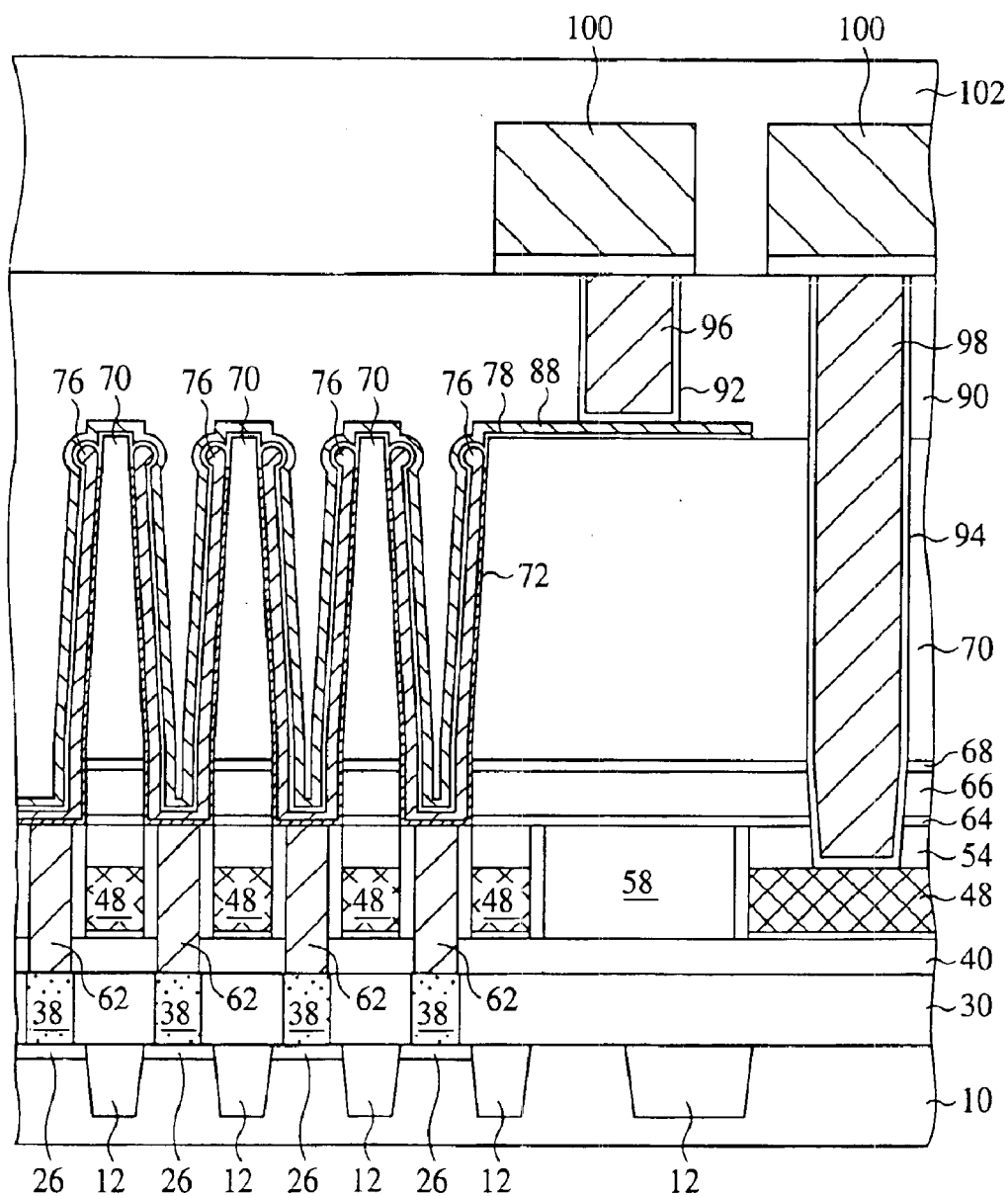
FIG. 19 is a diagrammatic sectional view of the semiconductor device according to a second embodiment of the present invention, which shows a structure thereof.

FIG. 19 is a diagrammatic sectional view of the semiconductor device according to the present embodiment, which shows a structure thereof. FIGS. 20A–20B, 21A–21B, and 22 are sectional views of the semiconductor device according to the present embodiment in the steps of the method for fabricating the same, which show the method.

First, the structure of the semiconductor device according to the present embodiment will be explained with reference to FIG. 17. The structure of the semiconductor device according to the present embodiment is the same in plane as that of the semiconductor device according to the first embodiment. FIG. 19 is a diagrammatic sectional view along the line B–B' in FIG. 8.

A device isolation film 12 is formed on a silicon substrate 10, defining device regions. Memory cell transistors each including a gate electrode 20 and source/drain diffused layers 24, 26 are formed in the device regions. As shown in FIG. 8, the gate electrodes 20 function as a conducting film which functions as word lines. An inter-layer insulation film 30 with plugs 36 and plugs 38 buried in, connected respectively to the source/drain diffused layer 24 and to the source/drain diffused layer 26 is formed on the silicon substrate 10 with the memory cell transistors formed on.

An inter-layer insulation film 40 is formed on the inter-layer insulation film 30. Bit lines 48 connected to the source/drain diffused layer 24 via the plugs 36 are formed on the inter-layer insulation film 40. As shown in FIG. 8, a plurality of the bit lines 48 are extended, intersecting the word lines (gate electrodes 20). An inter-layer insulation film 58 is formed on the inter-layer insulation film 40 with the bit lines 48 formed on. Plugs 62 connected to the plugs 38 are buried in the inter-layer insulation film 58.

An etching stopper film 64, an inter-layer insulation film 66 and an etching stopper film 68 and an inter-layer insulation film 70 are formed on the inter-layer insulation film 58. Openings 72 are formed, passed down to the plugs 62 through the inter-layer insulation film 70, the etching stopper film 68, the inter-layer insulation film 66 and the etching stopper film 64. A liner film 74 and storage electrodes are formed in the openings 72 along the inside walls and the bottom thereof. The storage electrodes 76 have the upper ends formed in a substantially spherical configuration. Plate electrodes 88 are formed on the storage electrodes 76 with a capacitor dielectric film 78 interposed therebetween.

An inter-layer insulation film 90 is formed on the plate electrodes 88. Interconnection layers 100 are formed on the inter-layer insulation film 90, connected to the plate electrodes 88 via the plugs 96 or connected to the bit lines 48 via the plugs 98. An inter-layer insulation film 102 is formed on the inter-layer insulation film 90 with the interconnection layers 100 formed on.

Thus, a DRAM comprising memory cells each including one transistor and one capacitor is fabricated.

As described above, the semiconductor device according to the present embodiment is characterized mainly in that the concave capacitors include the storage electrodes 76 having the edges of the upper ends rounded in a substantially spherical configuration and thickened. The semiconductor device having such structure can mitigate electric field concentration on the upper end of the storage electrodes and can preclude leakage current increase and dielectric breakdown of the capacitor dielectric film.

Then, the method for fabricating the semiconductor device according to the present embodiment will be explained with reference to FIGS. 20A–20B, 21A–21B, and 22. FIGS. 20A–20B, 21A–21B, and 22 are sectional views of the semiconductor device along the line B–B' in FIG. 8 in the steps of the method for fabricating the semiconductor device.

Figure 20A:
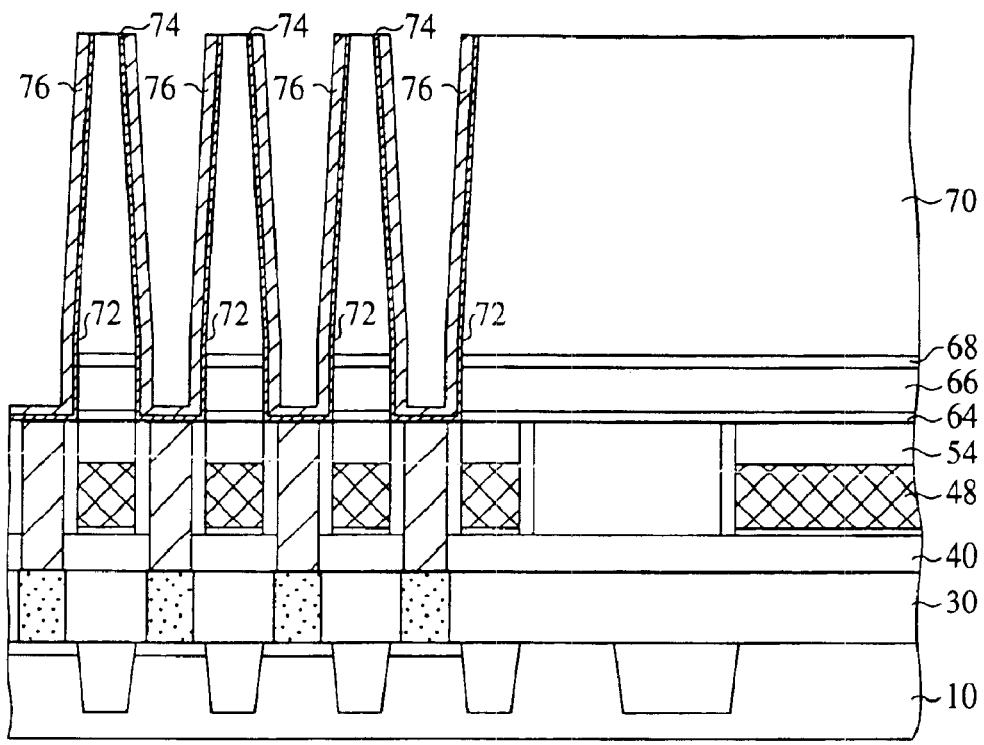
FIGS. 20A–20B, 21A–21B, and 22 are sectional views of the semiconductor device according to the second embodiment of the present invention in the steps of the method for fabricating the same, which explain the method.

In the same way as in the method for fabricating the semiconductor device according to the first embodiment shown in FIGS. 10A to FIG. 11C and FIG. 12A to FIG. 15B, the liner film 74 and the storage electrode 76 are formed on the inside wall and the bottom of the openings 72 passed down to the plugs 62 through the inter-layer insulation film 70, the etching stopper film 68 and the inter-layer insulation film 66 (FIG. 20A).

Figure 20B:
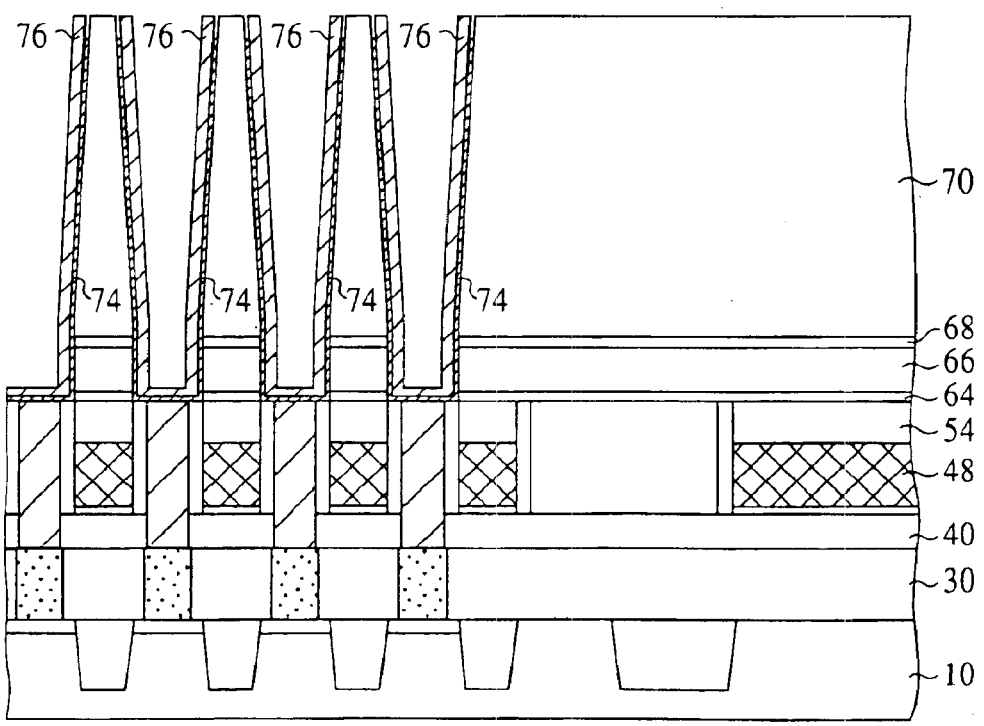

Then, the liner film 74 is etched with an aqueous solution containing, e.g., sulfuric acid and hydrogen peroxide selectively with respect to the storage electrodes 76, the etching stopper film 68 and the inter-layer insulation film 66 to etch the upper end of the liner film 74 about 40 nm from the surface of the inter-layer insulation film 70 (FIG. 20B).

Figure 21A:
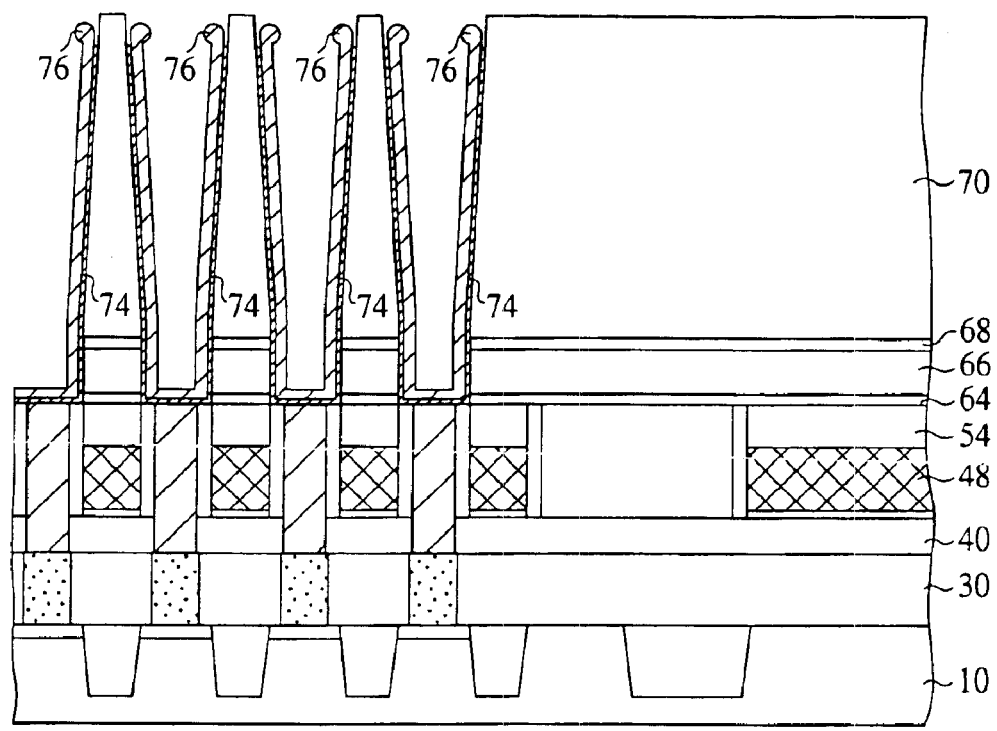

Then, a heat treatment for rounding the edges of the upper ends of the storage electrodes 76 is made to round and thicken the upper ends of the storage electrodes in a substantially spherical configuration (FIG. 21A). The heat treatment is conducted at 540° C. in an ambient including hydrogen and nitrogen of a 1 Torr pressure to reconstitute the crystals of ruthenium forming the storage electrodes 76 to thereby round the edges of the upper ends of the storage electrodes 76.

Figure 23A:
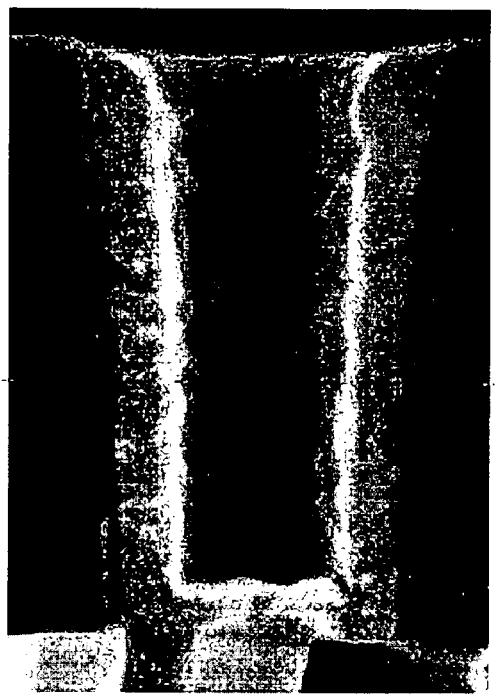
FIGS. 23A and 23B are cross-sectional SEM image of configurations of the storage electrodes before and after heat treatment.
Figure 23A:
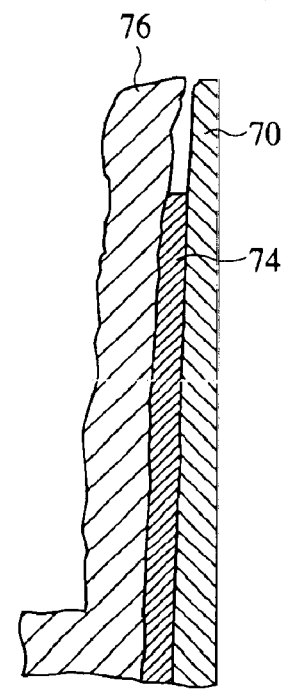
Figure 23B:
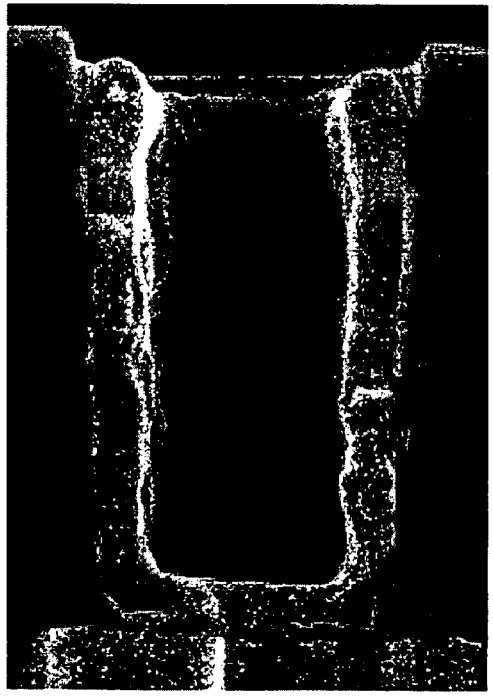
Figure 23B:
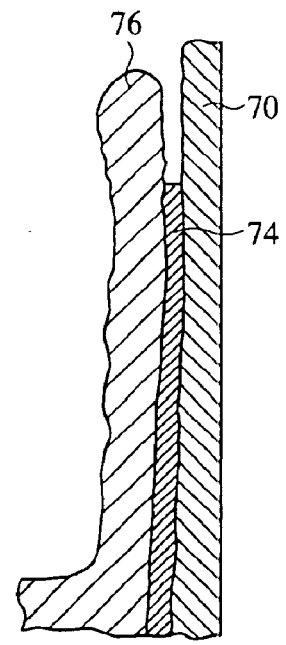

FIGS. 23A and 23B are cross sectional SEM image of configurations of the storage electrodes before and the after heat treatment. As shown, the insides of the storage electrodes 76 as-formed are caved due to dishing, having an acute edge on the outside (FIG. 23A). After the heat treatment, the edge is rounded and thickened in a substantially spherical thickened configuration (FIG. 23B). After the heat treatment, the border between the bottom and the side surface is also rounded.

Next, a 10–30 nm-thick $Ta_2O_5$ film or BST film, for example, is deposited on the entire surface by, e.g., CVD method to form the capacitor dielectric film 78 of the $Ta_2O5$ or BST.

Then, a 30–50 nm-thick ruthenium film, for example, is deposited on the entire surface by, e.g., CVD method to form the plate electrodes 88 of the ruthenium film. For example, the ruthenium film of a required thickness is formed, e.g., by forming an about 10 nm-thick seed layer by sputtering method and then depositing ruthenium film by CVD method. The ruthenium film is formed by CVD method, for example, at 300° C. film forming temperature, 0.05 Torr pressure, 0.06 cc flow rate of $Ru(EtCp)_2$ as a ruthenium source and 160 sccm $O_2$ gas.

Figure 21B:
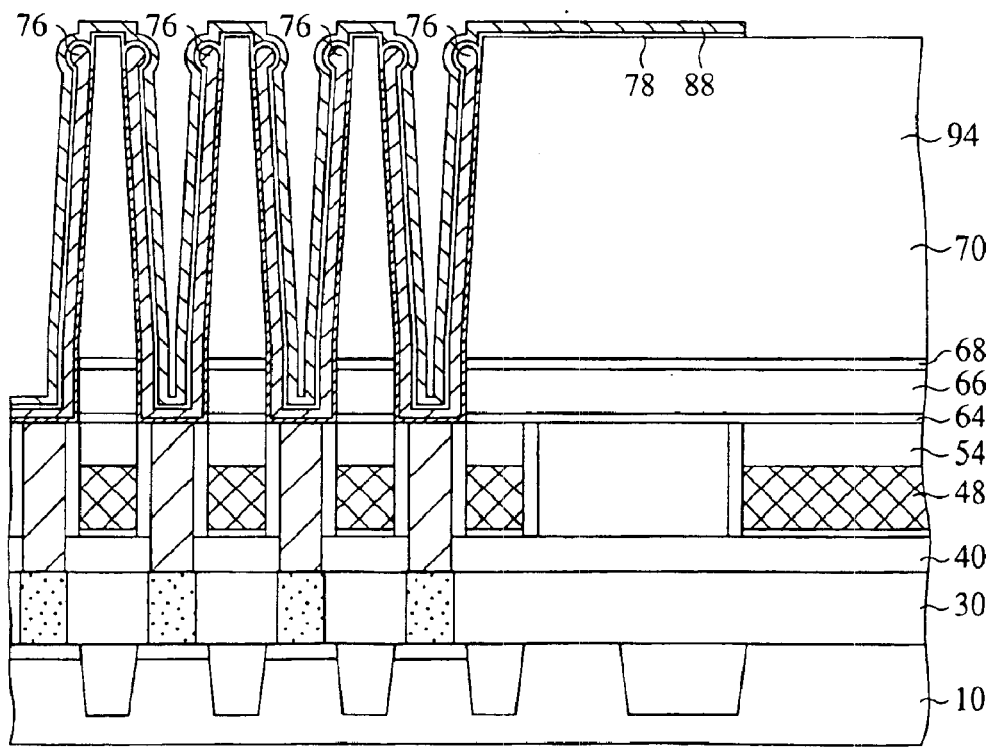

Then, the plate electrodes 88 and the capacitor dielectric film 78 are patterned by lithography and etching to remove the plate electrodes 88 and the capacitor dielectric film 78 in a peripheral circuit region (FIG. 21B).

Next, a 1000 nm-thick silicon oxide film, for example, is deposited on the entire surface by, e.g., CVD method, and the surface of the silicon oxide film is polished by CMP method to form the inter-layer insulation film 90 of the silicon oxide film having the surface planarized.

Figure 22:
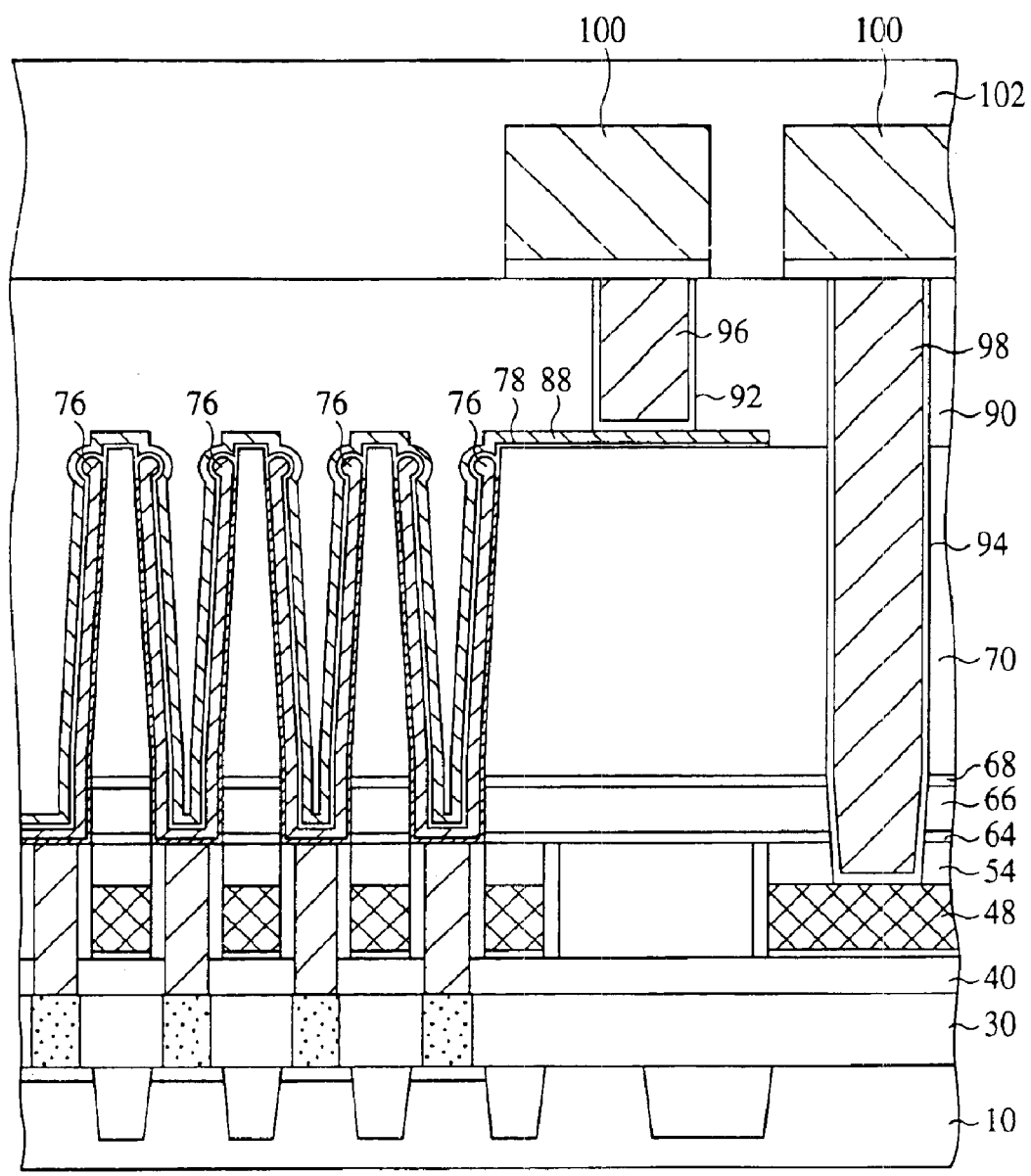

Then, the interconnection layers 100 are formed on the inter-layer insulation film 90, connected to the plate electrodes 88 via the plugs 96 buried in the contact holes 92 or connected to the bit lines 48 via the plugs 98 buried in the contact holes 94 (FIG. 22).

Thus, the DRAM comprising memory cells each including one transistor and one capacitor is fabricated.

Figure 24:
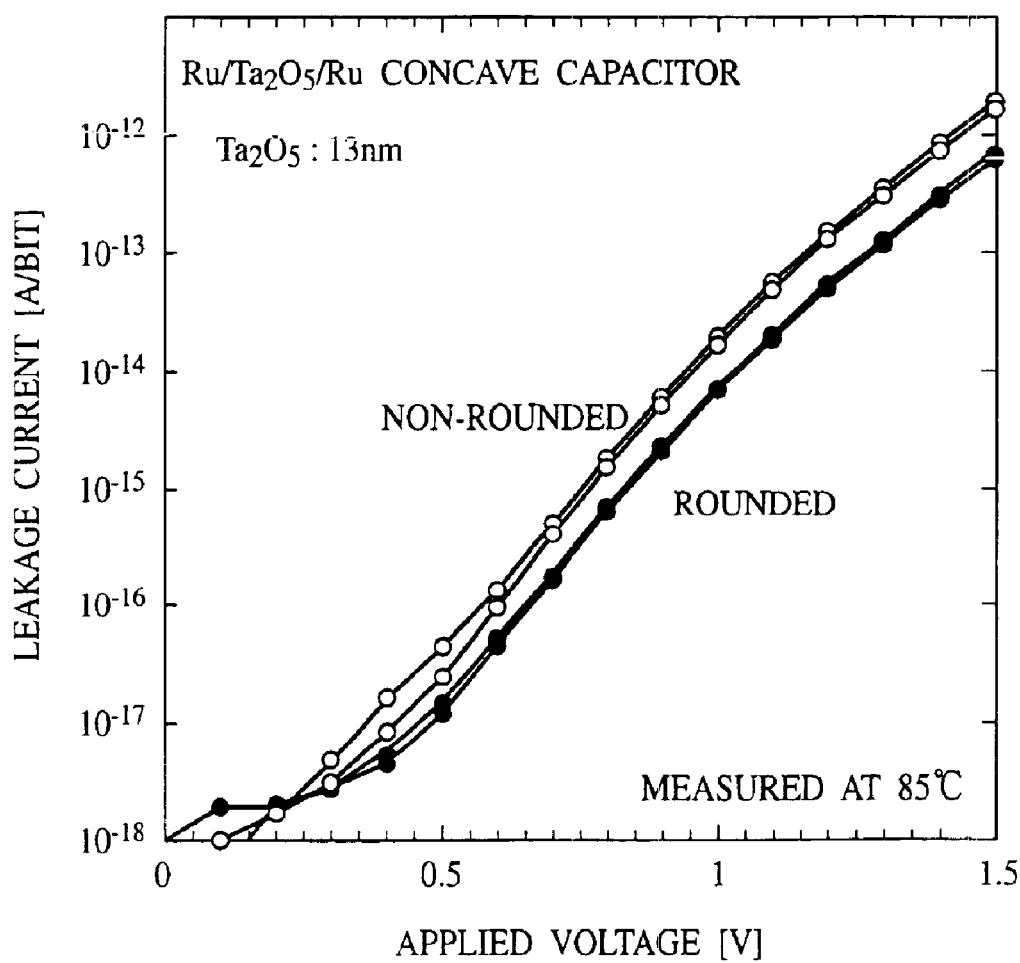
FIG. 24 is a graph of leakage current characteristics of a capacitor specimen heat-treated for rounding the storage electrode, and a capacitor specimen not heat treated for rounding the storage electrode.

FIG. 24 is a graph of leakage current characteristics of the capacitors of a specimen which has been heat-treated to have the storage electrodes rounded and leakage current characteristics of the capacitors of a specimen which has not been heat-treated. As shown, the heat treatment has decreased leakage current. It could be confirmed that the heat treatment mitigates electric field concentration on the upper ends of the storage electrodes.

As described above, according to the present embodiment, the concave capacitor include the storage electrodes having the edges rounded and thickened in a substantially spherical configuration, whereby electric field concentration on the upper ends of the storage electrodes can be mitigated, and leakage current increase and dielectric breakdown of the capacitor dielectric film can be precluded.

[Modifications]

The present invention is not limited to the above-described embodiments and can cover other various modifications.

For example, in the above-described first embodiment, the heat treatment is made after the liner film 74 is removed to expose the outside surfaces of the storage electrodes 76. However, the heat treatment may be made with the upper end of the liner film etched as shown in FIG. 2B or FIG. 2C. The heat treatment is not essentially once and may be made a plurality of times in these steps.

In the above-described second embodiment, the heat treatment is made after the upper end of the liner film has been etched by more than a half a thickness of the storage electrodes to form the storage electrodes having the upper ends thickened. However, it is possible that the liner film is not etched, and the inside edges alone of the storage electrodes are rounded. It is also possible that the heat treatment is made after the upper end of the liner film has been etched by about a half a thickness of the storage electrodes to provide a curvature radius of about a half the thickness of the storage electrodes.

The process of the heat treatment and a configuration of the storage electrodes after the heat treatment can be suitably selected as exemplified in FIGS. 1A–1C, 2A–2D, 3A–3D, and 4A–4H.

The above-described first embodiment exemplifies that the present invention is applied to a semiconductor device including the cylindrical capacitors, and the above-described second embodiment exemplifies that the present invention is applied to a semiconductor device including concave capacitors. However, the present invention is not limited to the cylindrical capacitors and the concave capacitors.

Figure 25:
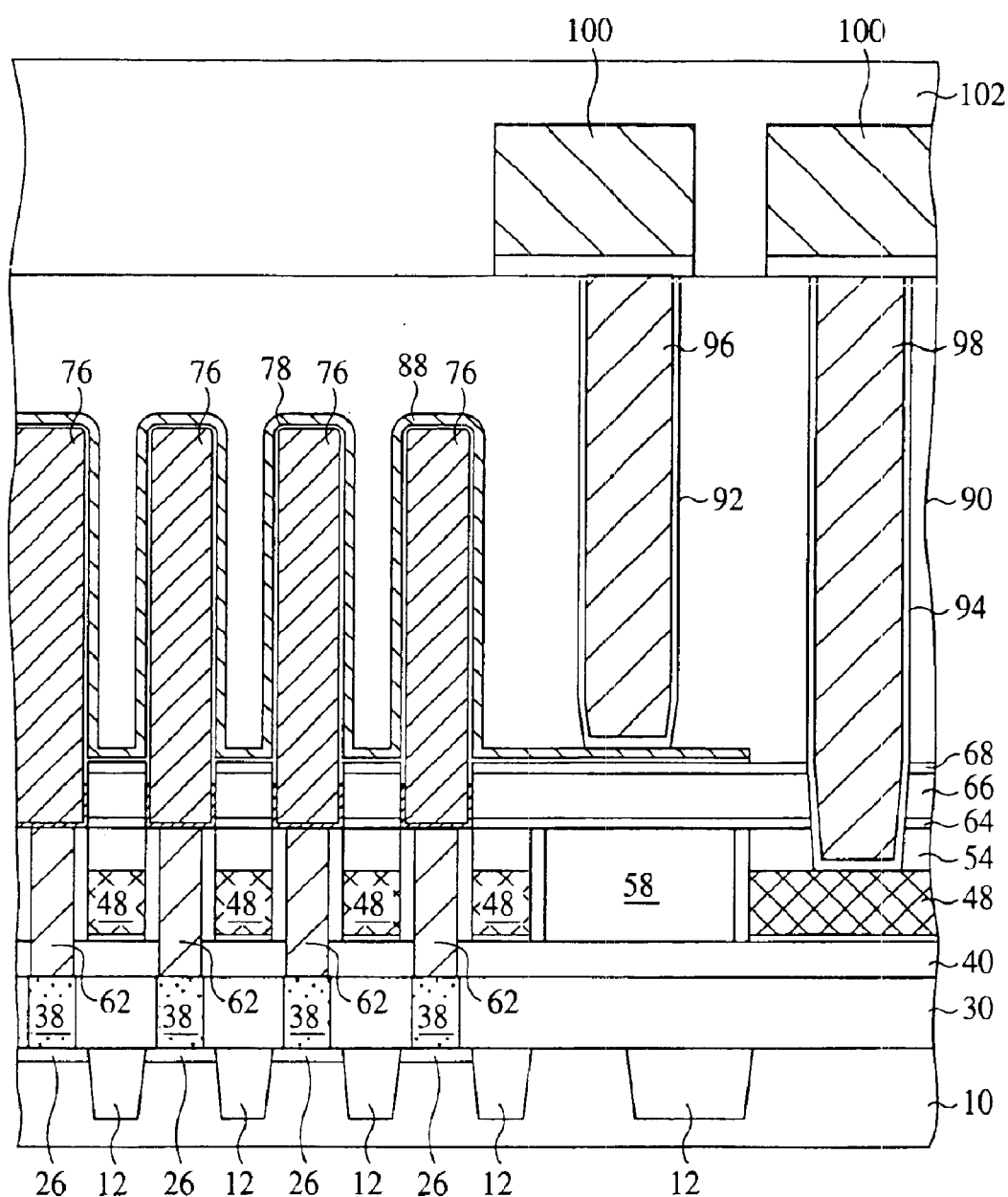
FIG. 25 is a diagrammatic sectional view of a semiconductor device according to a modification of the embodiments of the present invention, which shows a structure thereof.
Figure 26A:
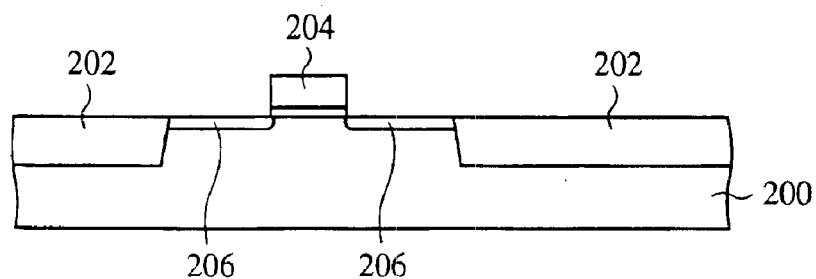
FIGS. 26A–26C and 27A–27B are sectional views of the conventional semiconductor device in the steps of the method for fabricating the semiconductor device, which explain the method.
Figure 26B:
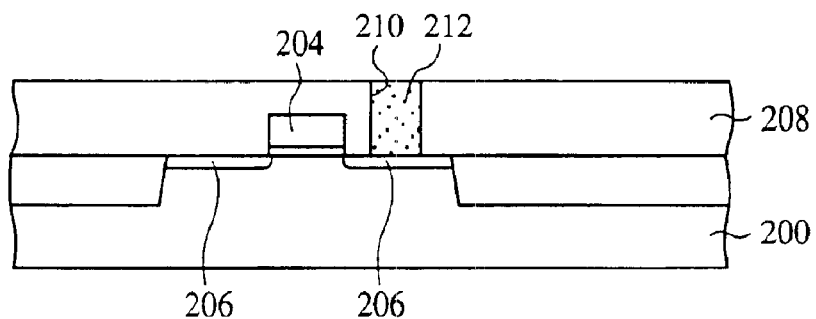
Figure 26C:
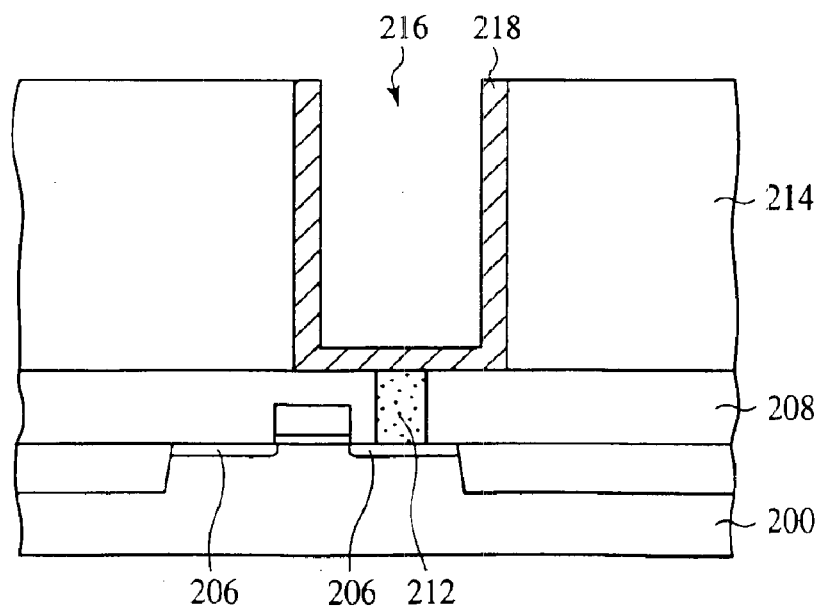
Figure 27A:
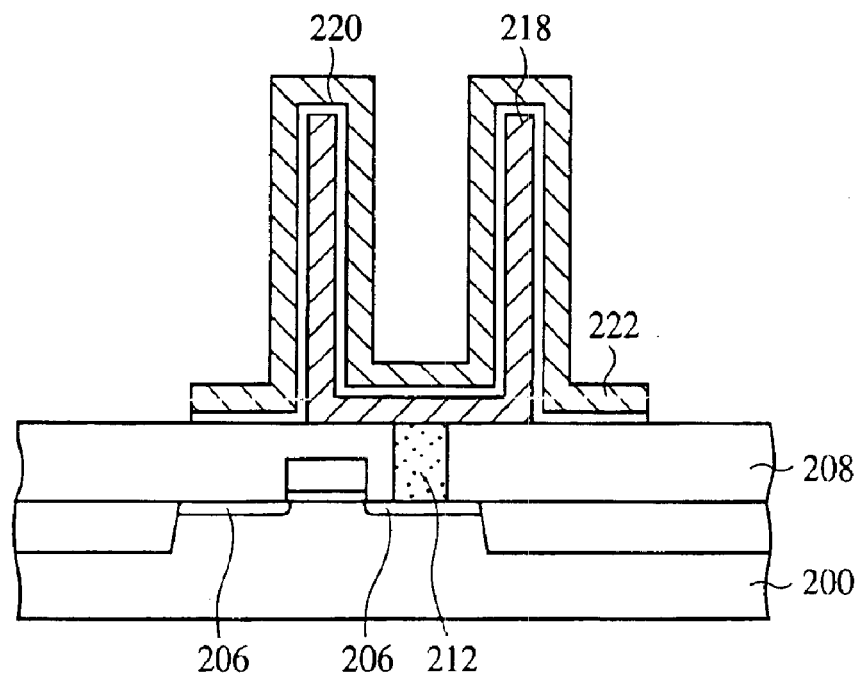
Figure 27B:
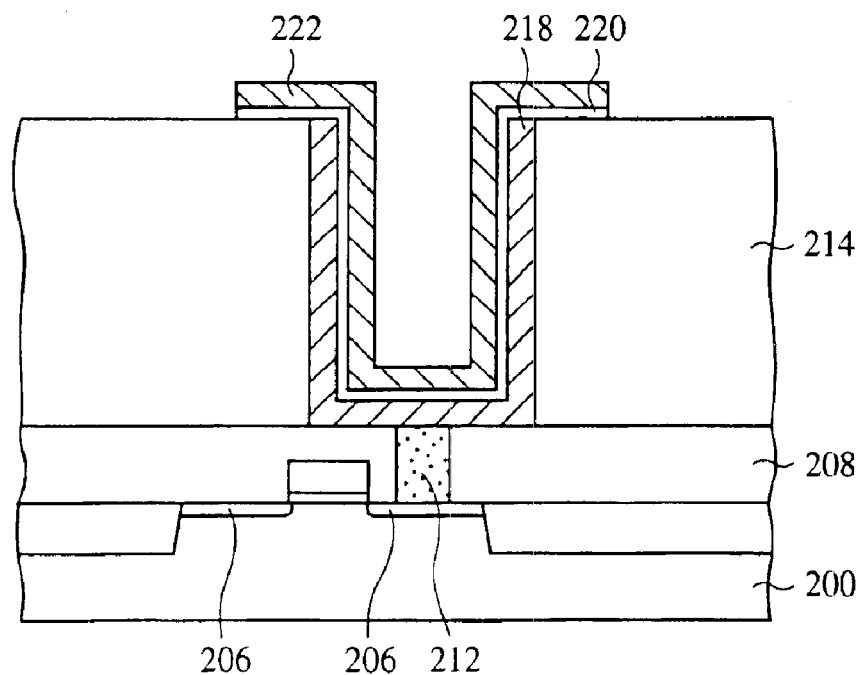
Figure 28A:
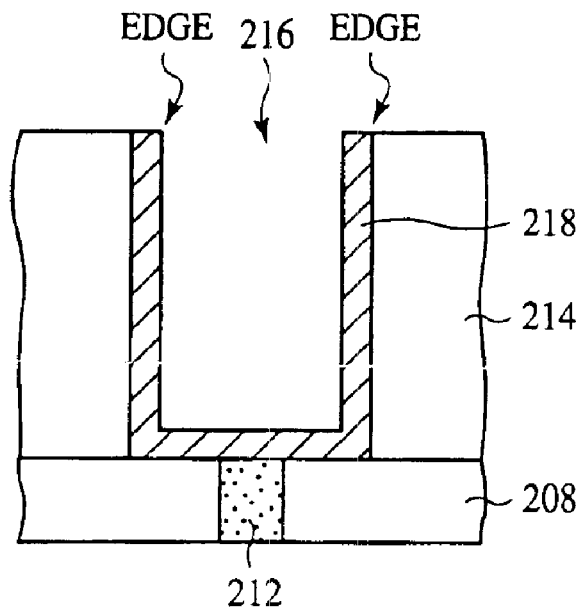
FIGS. 28A and 28B are views explaining the problems of the conventional semiconductor device.
Figure 28B:
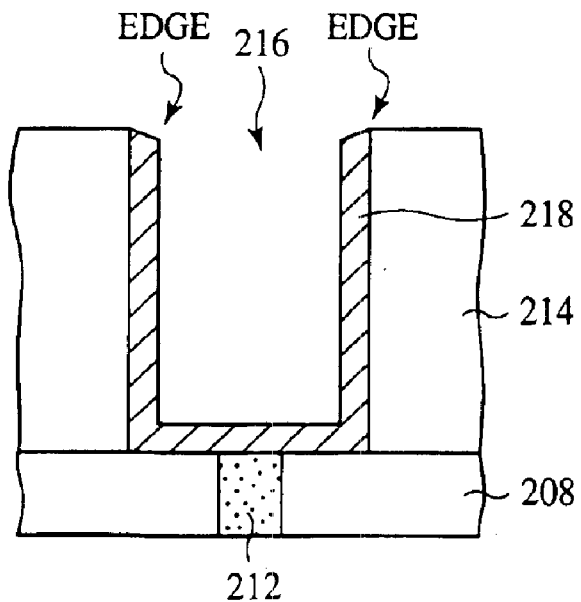

For example, in a semiconductor device comprising pillar-shaped capacitors using pillar-shaped storage electrodes it is possible to round the edges of the upper ends of the storage electrodes 76 (FIG. 25). In a semiconductor device comprising thick-film stacked capacitors, it is also possible to round the edge of the upper ends of the storage electrodes.

For the pillar-shaped capacitors, in the step of the method for fabricating the semiconductor device according to the first embodiment shown in FIG. 15B, for example, it is possible that the storage electrodes 76 are formed, burying the openings 72, and then the heat treatment for rounding the edge follows. For the thick-film stacked capacitors, ruthenium film forming the storage electrodes is patterned, and then the heat treatment for rounding the edges follows.

In the above-described embodiments, the storage electrodes are formed of ruthenium film, but the present invention is not limited to ruthenium film. For example, in a case where the storage electrodes are formed of platinum, which is a noble metal as is ruthenium, the same effects as described in the above-described embodiments can be produced.

In the above-described embodiments, the present invention is applied to DRAM, but the present invention is applied widely to semiconductor devices comprising capacitors using cylindrical storage electrodes. Ferroelectric memories are known as a memory device using the polarization inversion characteristics of the ferroelectric capacitors. The present invention is applied to, e.g., ferroelectric memories, whereby the same effects as described in the specification of the present application can be produced.

What is claimed is:

1. A semiconductor device comprising:
    a capacitor formed above a semiconductor substrate and including
        a straight cylindrical-shaped storage electrode having a hollow cylindrical projection, an edge of the hollow cylindrical projection being located on an uppermost part of the straight cylindrical-shaped storage electrode,
        a capacitor dielectric film formed on the storage electrode, and
        a plate electrode formed on the capacitor dielectric film, the edge of the hollow cylindrical projection being rounded and having a larger thickness than a thickness in a remaining portion of the hollow cylindrical projection.

2. A semiconductor device according to claim 1, wherein the straight cylindrical-shaped storage electrode has a thickness gradually thickened toward the edge of the hollow cylindrical projection.

3. A semiconductor device according to claim 1, wherein a side surface of the hollow cylindrical projection is tilted and a circumferential length of the hollow cylindrical projection is gradually increased toward the edge of the hollow cylindrical projection.

4. A semiconductor device according to claim 2, wherein a side surface of the hollow cylindrical projection is tilted and a circumferential length of the hollow cylindrical projection is gradually increased toward the edge of the hollow cylindrical projection.

5. A semiconductor device according to claim 1, wherein a border portion between a side surface and a bottom surface of the straight cylindrical-shaped storage electrode is rounded.

6. A semiconductor device according to claim 2, wherein a border portion between a side surface and a bottom surface of the straight cylindrical-shaped storage electrode is rounded.

7. A semiconductor device comprising:
    a capacitor formed above a semiconductor substrate and including
        a straight cylindrical-shaped storage electrode having a hollow cylindrical projection, an edge of the hollow cylindrical projection being located on an uppermost part of the straight cylindrical-shaped storage electrode,
        a capacitor dielectric film formed on the storage electrode, and
        a plate electrode formed on the capacitor dielectric film, the straight cylindrical-shaped storage electrode being formed of a metal film and having a larger thickness at the edge of the hollow cylindrical projection than a thickness in a remaining portion of the hollow cylindrical projection.

8. A semiconductor device according to claim 7, wherein the straight cylindrical-shaped storage electrode has a thickness gradually thickened toward the edge of the hollow cylindrical projection.

9. A semiconductor device comprising:
    a capacitor formed above a semiconductor substrate and including
        a straight cylindrical-shaped storage electrode having a hollow cylindrical projection, an edge of the hollow cylindrical projection being located on an uppermost part of the straight cylindrical-shaped storage electrode,
        a capacitor dielectric film formed on the storage electrode, and
        a plate electrode formed on the capacitor dielectric film, the straight cylindrical-shaped storage electrode being formed of a metal film and the edge of the hollow cylindrical projection being rounded,
    wherein the straight cylindrical-shaped storage electrode has a thickness gradually thickened toward the edge of the hollow cylindrical projection.

* * * * *